(12) United States Patent
Wohler

(10) Patent No.: US 12,376,404 B2
(45) Date of Patent: Jul. 29, 2025

(54) OPTICAL COMPONENT WITH WAVEGUIDE BASED FILTER

(71) Applicant: Christian Wohler, Heidelberg (DE)

(72) Inventor: Christian Wohler, Heidelberg (DE)

( * ) Notice: Subject to any disclaimer, the term of this patent is extended or adjusted under 35 U.S.C. 154(b) by 0 days.

(21) Appl. No.: 18/195,369

(22) Filed: May 9, 2023

(65) Prior Publication Data

US 2023/0282664 A1    Sep. 7, 2023

Related U.S. Application Data

(63) Continuation of application No. 16/624,767, filed as application No. PCT/EP2018/066065 on Jun. 18, 2018, now Pat. No. 11,676,981.

(30) Foreign Application Priority Data

Jun. 21, 2017    (EP) ..................................... 17177092

(51) Int. Cl.
*H01L 27/146*    (2006.01)
*G02B 5/20*    (2006.01)
(Continued)

(52) U.S. Cl.
CPC ......... *H10F 39/8067* (2025.01); *G02B 5/204* (2013.01); *G02B 6/10* (2013.01); *H10F 39/18* (2025.01); *H10F 39/8053* (2025.01)

(58) Field of Classification Search
CPC . G02B 6/102; G02B 6/10; G02B 5/22; G02B 5/288; G02B 5/285; G02B 5/281;
(Continued)

(56) References Cited

U.S. PATENT DOCUMENTS 6,285,020 B1    9/2001    Kim et al.
7,646,943 B1    1/2010    Wober et al.
(Continued)

FOREIGN PATENT DOCUMENTS

CN    104025583 A    9/2014
CN    104025583 B    10/2016
(Continued)

OTHER PUBLICATIONS 17177092.8, Extended European Search Report, Jan. 11, 2018, 6 Pages.
(Continued)

*Primary Examiner* — John R Lee

(57) ABSTRACT

In some disclosed embodiments, an image sensor is provided for recording incident radiation may include a first layer for filtering the incident radiation by attenuating incident radiation with a frequency below a cutoff frequency and a second light-sensitive layer for absorbing radiation passing through the first layer. The first layer may precede the second light-sensitive layer in a direction of propagation of the incident radiation and the first layer includes at least one aperture passing through the first layer to the second light-sensitive layer for propagating radiation therethrough. The cross sectional size of the at least one aperture may be configured to provide a cutoff frequency so that incident radiation with a frequency below the cutoff frequency is attenuated inside the at least one aperture and incident radiation with a frequency above the cutoff frequency propagates through the at least one aperture.

14 Claims, 9 Drawing Sheets

(51) Int. Cl.
  *G02B 6/10* (2006.01)
  *H10F 39/00* (2025.01)
  *H10F 39/18* (2025.01)

(58) Field of Classification Search
  CPC .......... G02B 5/28; G02B 5/208; G02B 5/204;
    H01L 27/14645; H01L 27/14643; H01L
    27/146; H01L 27/14601; H01L 27/14629;
    H01L 27/1462; H01L 27/14623; H01L
    27/14625; H10F 39/184; H10F 39/182;
    H10F 39/18; H10F 39/80; H10F 39/803;
    H10F 39/805; H10F 39/8053; H10F
    39/8057; H10F 39/806; H10F 39/8063;
    H10F 39/8067
  See application file for complete search history.

(56) References Cited

U.S. PATENT DOCUMENTS

| | | | |
|---|---|---|---|
| 9,036,960 | B2 | 5/2015 | Augusto |
| 11,676,981 | B2* | 6/2023 | Woehler ................ G02B 5/204 359/885 |
| 2005/0133879 | A1 | 6/2005 | Yamaguti et al. |
| 2008/0170143 | A1 | 7/2008 | Yoshida |
| 2010/0308214 | A1 | 12/2010 | Wober |
| 2011/0108938 | A1 | 5/2011 | Nozaki et al. |
| 2011/0216229 | A1 | 9/2011 | Mary et al. |
| 2013/0075591 | A1 | 3/2013 | Otake et al. |
| 2015/0162462 | A1 | 6/2015 | Berini et al. |
| 2016/0254303 | A1 | 9/2016 | Takimoto et al. |
| 2019/0229223 | A1 | 7/2019 | Chanda et al. |
| 2020/0026903 | A1 | 1/2020 | Hai et al. |
| 2020/0387686 | A1 | 12/2020 | Jhang et al. |
| 2021/0143201 | A1 | 5/2021 | Woehler |
| 2023/0282664 | A1* | 9/2023 | Wohler .................. G02B 6/10 359/885 |

FOREIGN PATENT DOCUMENTS

| | | |
|---|---|---|
| GB | 2351556 A | 1/2001 |
| JP | 2005019958 A | 1/2005 |
| JP | 2008177191 A | 7/2008 |
| JP | 2009302096 A | 12/2009 |
| JP | 2010507281 A | 3/2010 |
| WO | WO-2007021553 A2 | 2/2007 |
| WO | WO-2016158128 A1 | 10/2016 |

OTHER PUBLICATIONS

Communication pursuant to Article 94(3) issued in EP Application No. 18733819.9-1211, dated Oct. 27, 2021, 5 pages.
EP22164236.6, Extended European Search Report, Jul. 26, 2022, 5 pages.
Notice in Opposition issued in European Application No. 18733819.9 dated Jan. 27, 2023, 14 pages.
Notice of Final Rejection issued in KR Application No. 10-2019-7037101 dated Oct. 25, 2021, 8 pages.
Notice of Reasons for Rejection issued in JP Patent Application No. 2019-555005, drafted Feb. 8, 2021, 8 pages.
Notice of Reasons for Rejection issued in JP Patent Application No. 2019-555005, drafted Jun. 24, 2021, 5 pages.
Notice of submission of opinions issued in KR Application No. 10-2021-7037963, mailed Dec. 8, 2021, 10 pages.
PCT/EP2018/066065, International Search Report and Written Opinion, Oct. 1, 2018, 10 Pages.
Wikipedia: "Evanescent field," retrieved from the internet URL: https://en.wikipedia.org/wiki/Evanescent_field, 7 pages.
Wikipedia: "Tuple," retrieved from the internet URL: https://en.wikipedia.org/wiki/Tuple, 8 pages.
Wikipedia: "Waveguide (electromagnetism)," retrieved from the internet URL: https://en.wikipedia.org/wiki/Waveguide_(electromagnetism), 10 pages.
Inoue D., et al., "Polarization Independent Visible Color Filter Comprising an Aluminum Film with Surface-Plasmon Enhanced Transmission through a Subwavelength Array of Holes," Applied Physics Letters, Feb. 28, 2011, vol. 98, No. 9, 4 pages.
Lee H., et al., "Color Filter Based On a Subwavelength Patterned Metal Grating," Optics Express, Nov. 6, 2007, vol. 15, No. 23, pp. 15457-15463.
Lezec H.J., et al., "Diffracted Evanescent Wave Model for Enhanced and Suppressed Optical Transmission through Subwavelength Hole Arrays," Optics Express, Aug. 9, 2004, vol. 12, No. 16, pp. 3629-3651.
Orfanidis S.J., "Electromagnetic Waves and Antennas," Rutgers University, 2016, pp. 363-378.
Pacifici D., et al., "Universal Optical Transmission Features In Periodic and Quasiperiodic Hole Arrays," Optics Express, Jun. 6, 2008, vol. 16, No. 12, pp. 9222-9238.
Parsons J., et al., "Localized Surface-Plasmon Resonances in Periodic Nondiffracting Metallic Nanoparticle and Nanohole Arrays," Physical Review B, 2009, vol. 79, pp. 073412-1-073412-4.
Wikipedia, "Evanescent Field," Wayback Machine, Jun. 9, 2016, 6 pages, Retrieved from the Internet: URL:https://web.archive.org/web/20160609222117/https://en.wikipedia.org/wiki/Evanescent_field.
Wikipedia, "Tuple," Wayback Machine, Apr. 21, 2017, 6 pages, Retrieved from the Internet: URL:https://web.archive.org/web/20170421062617/https://en.wikipedia.org/wiki/Tuple.
Wikipedia, "Waveguide (electromagnetism)," Wayback Machine, May 7, 2017, 11 pages, Retrieved from the Internet: URL:https://web.archive.org/web/20170507052114/https://en.wikipedia.org/wiki/Waveguide_(electromagnetism).
Yokogawa S., et al., "Plasmonic Color Filters for CMOS Image Sensor Applications," Nano Letters, Jul. 16, 2012, vol. 12, No. 8, pp. 4349-4354.

* cited by examiner

OPTICAL COMPONENT WITH WAVEGUIDE BASED FILTER

CROSS-REFERENCE TO RELATED APPLICATIONS

This application is a continuation of U.S. application Ser. No. 16/624,767, filed on Dec. 19, 2019, which is a 371 of International Application No. PCT/EP2018/066065, filed on Jun. 18, 2018, which claims priority to European Application no. 17177092.8, filed Jun. 21, 2017. The entire contents of these parent applications, as filed, are hereby incorporated by reference in their entirety. Specification amendments presented and accepted in U.S. application Ser. No. 16/624,767, have been incorporated in the specification filed in the present case.

BACKGROUND

The present invention relates generally to optical components and more specifically to optical components with layers that provide cutoff frequencies for incident radiation. The optical components may be active optical components such as image sensors or passive optical components such as lenses.

Today, important active optical components are image sensors, i.e. electronic devices that use an array of light sensors to measure light intensities in different areas and thus record an image. Typical image sensors are semiconductor charge coupled devices (CCD) and complementary metal oxide semiconductors (CMOS) chips. These sensors use mostly color filter arrays with colored filter elements using e.g. the Bayer pattern for distinguishing the different colors of light hitting the image sensors. Another type of image sensor is based on Foveon's scheme of color separation that determines the color of light by identifying the depth in which the light is recorded. This scheme is based on the circumstance that light with a longer wavelength has a larger penetration depth in the sensor.

Known image sensors may require an additional infrared filter because infrared light is measured by typical sensors but this portion of the light is not desired because it contaminates colors of the visible light.

Furthermore, there is a general desire to create image sensors with small pixels, high light measurement efficiency, and good color separation. Image sensors with color filter arrays lose usually 50% or more of the light intensity through the color filter. Image sensors with color filter arrays or based on Foveon's scheme may have a limited color separation. There is also a general desire to create image sensors with pixels that collect and measure light independently of the angle with which the light hits the image sensors.

Efficient filtering is also a concern among passive optical components, such as lenses, fibre couplers etc. Such optical components often have a frequency dependent behavior, like chromatic aberrations in the case of lenses, which are undesired in imaging applications. Thus, it would be desirable to have passive optical elements with improved imaging behavior.

SUMMARY OF THE INVENTION

One task may be to provide an image sensor that does not require a conventional infrared color filter to filter out infrared light. A further task may be to provide an image sensor that efficiently separates and measures different colors of light hitting an image sensor. A further task may be to provide an image sensor where the light hitting the image sensor with a narrow angle (i.e. highly non-perpendicular to the surface) has a reduced amount of light spillover to neighboring pixels or has pixels with a collection and measurement efficiency which is less dependent on the angle of the light. A further task may be to provide an image sensor that allows color separation for small pixels in a structurally simple way (e.g. without requiring a conventional color filter array) which may simplify fabrication of such an image sensor.

According to a first aspect of the invention, an image sensor for recording incident radiation may include a first layer for filtering the incident radiation and a second light-sensitive layer for absorbing the radiation passing through the first layer. The first layer may be made of one or more materials that are opaque for the incident radiation. The first layer precedes the second light-sensitive layer in a direction of propagation of the incident radiation and the first layer comprises at least one aperture passing through the first layer to the second layer for propagating radiation therethrough. The cross sectional size of the at least one aperture may be configured to provide a cutoff frequency so that incident radiation with a frequency below the cutoff frequency is attenuated inside the at least one aperture and incident radiation with a frequency above the cutoff frequency propagates through the at least one aperture.

In an embodiment, the first layer may have many apertures which have a certain number of different cross sectional sizes (e.g. one size or three different sizes) so that the first layer provides a filter function with one or more different cutoff frequencies at different positions in the plane of the first layer. The second light-sensitive layer may record the intensity and the position of radiation passing through the different apertures of the first layer. Therefore, an image sensor according to an embodiment is able to record light intensity of certain wavelength ranges at different positions. Such an image sensor may be used in a similar way as a conventional image sensor which may be found e.g. in digital cameras or a cell phones. In other words, the first layer may be used to provide color separation into one or more light components and the second light-sensitive layer of the image sensor may record the one or more light components in a similar way as a light-sensitive layer of a conventional image sensor records the light.

The image sensor addresses one or more tasks mentioned above for the following reasons: The filter layer may have one or more apertures that provide a cutoff frequency that filters out infrared light but allows for propagation of light with a greater frequency (e.g. red, green, and blue light). The at least one aperture may also provide a cutoff frequency that lies in a different range of the light spectrum to measure one or more different colors of the visible light spectrum. Apertures of different sizes may be combined to measure and separate individual colors of light hitting the image sensor by e.g. subtracting measured radiation propagating through apertures with different cutoff frequencies. Incident radiation that propagates through the at least one aperture may propagate by coupling to a propagating mode inside the at least one aperture so that this radiation is not refracted and this may reduce light spillover to neighboring pixels and/or dependence of collection and measurement efficiency on the angle of light hitting the sensor. Guidance of propagating light through the at least one aperture may also reduce light spillover and/or dependence of collection and measurement efficiency on the angle of light. Image sensors with a filter layer with apertures may be structurally simple because they may be fabricated by standard chip fabrication technology and may not require e.g. provision of a conventional color filter array with colored filter elements. This feature may be relevant for small pixels (e.g. pixels with a pixel pitch below 1 µm). The degree of color separation, that is, how strongly light in a certain range (e.g. below a cutoff frequency) is attenuated, can be controlled through the depth of the at least one aperture. As a consequence, a stronger color separation can be achieved by using an aperture that is deeper or by using a thicker first layer for filtering the incident light.

For any one of the aspects disclosed herein, the at least one aperture may be considered as a waveguide for light and the first layer may be considered as a waveguide based filter. In waveguide technology, it is known that the width of waveguides of electromagnetic waves imposes a cutoff frequency below which no electromagnetic waves propagate through the waveguide but instead decay exponentially.

According to a second aspect of the invention an optical element includes a first layer for filtering radiation and a transparent element. The first layer includes at least one aperture passing through the first layer to the transparent element for propagating radiation therethrough. The cross sectional size of the at least one aperture is configured to provide a cutoff frequency so that radiation with a frequency below the cutoff frequency is attenuated inside the at least one aperture and radiation with a frequency above the cutoff frequency propagates through the at least one aperture.

The second aspect addresses a task of providing efficient filtering for passive optical components, such as lenses, fibre couplers, or generally transparent elements that are a part of passive optical components. A further task may be to improve the imaging behavior of such optical components by providing an optical element with a certain filtering characteristic which reduces an undesired frequency dependent behavior of the passive optical component.

The first and second aspects of the invention may share one or more features and accordingly, embodiments of such shared features may be identical for both aspects. In an example, an embodiment of the first layer for filtering radiation may be used for an image sensor and also for an optical element. Therefore, statements made in connection with the first layer of an image sensor are also valid for the first layer of an optical element and the other way around.

DETAILED DESCRIPTION OF EMBODIMENTS

Figure 1:
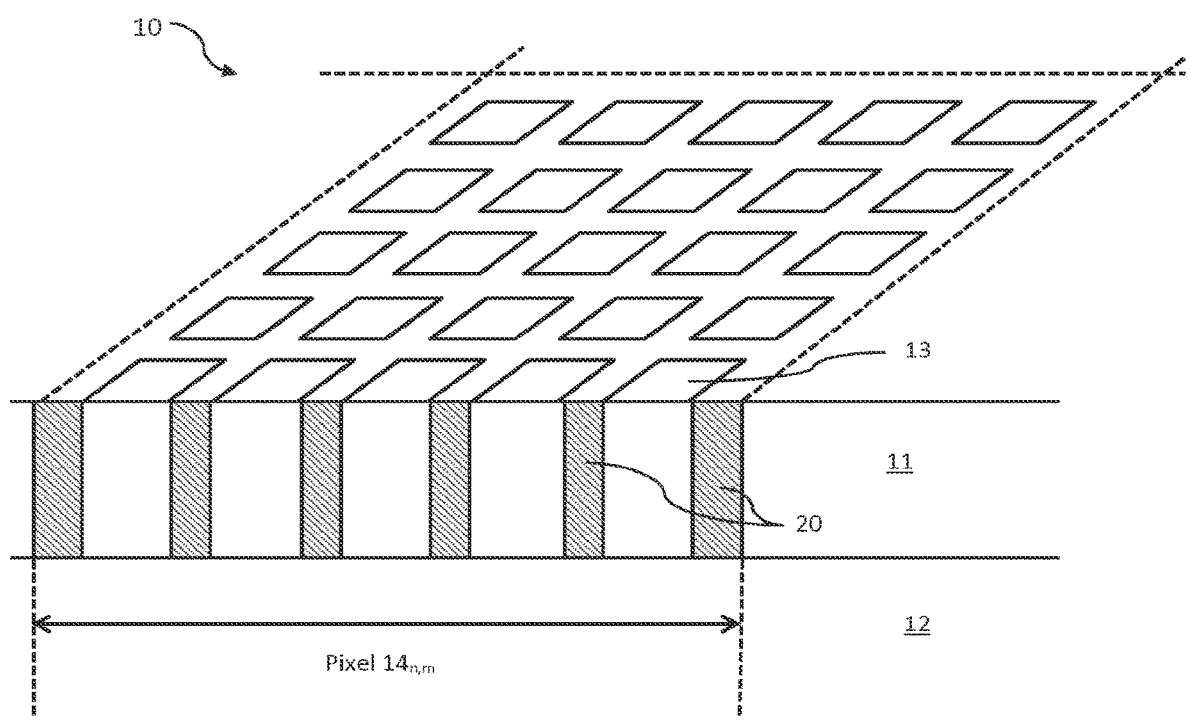
FIG. 1 is a cut sectional view of an image sensor according to an embodiment.

Incident radiation as used herein, i.e. for any or all of the aspects and embodiments of the invention, is electromagnetic radiation and may include visible light or visible light with infrared light and/or ultraviolet (UV) light.

Preferably, incident radiation with a frequency below the first cutoff frequency decays exponentially inside the at least one aperture. Thus, the term "cut-off frequency" is preferably defined as that limit frequency below which there is an exponential decay of the electromagnetic waves with increasing depth of the aperture. The exponential decay is used in accordance with waveguide theory. It is, of course, possible to employ different definitions for cut-off frequency, for example one can define a further cut-off frequency below which the transmitted intensity is reduced to a specified value between e.g. 90% and 0% of the intensity of the incident radiation.

Incident radiation with a frequency above the second cutoff frequency propagates through the at least one aperture, that is, there is a mode inside the aperture that allows for propagation of radiation. In real world apertures, the propagating radiation may still be reduced in intensity but the reduction will be measurably smaller than for radiation below the cutoff frequency. In standard waveguide theory, the cutoff frequency may be equal to one specific value but in embodiments, there may be a transitional frequency range between a first cutoff frequency below which radiation is attenuated inside the at least one aperture and a second cutoff frequency above which radiation propagates through the at least one aperture. The frequency range between the first cutoff frequency and the second cutoff frequency may be caused by e.g. imperfections in the aperture or the walls of the aperture or other non-ideally circumstances or also by specific forms of the aperture.

Generally, a cutoff frequency as used herein with any or all embodiments may be a cutoff frequency range (limited e.g. by the first cutoff frequency and the second cutoff frequency) so that incident radiation with a frequency below the cutoff frequency range is attenuated inside the at least one aperture and incident radiation with a frequency above the cutoff frequency range propagates through the at least one aperture. In other words, the term cutoff frequency as used herein may be defined as a cutoff frequency range and may be replaced with the term cutoff frequency range. According to standard waveguide theory, a waveguide may have a lowest cutoff frequency below which incident radiation cannot propagate through the at least one aperture because there is no propagation mode. Generally, a cutoff frequency as used herein with any or all embodiments may mean such a lowest cutoff frequency and may not include cutoff frequencies that are greater than the lowest cutoff frequency. There may be also more than one propagation mode which have the same lowest cutoff frequency (within a certain range). In an example, a square aperture (i.e. a rectangular aperture with equal side lengths) may have two propagation modes which have the same lowest cutoff frequency.

Expressions like "equal to" and "greater than" as used herein are not meant in the strict mathematical sense, but are to be understood as meaning "substantially equal" and "substantially greater than", respectively. Possible definitions of which values are "substantially equal" may be, for use with any or all embodiments "equal within deviations that are caused by manufacturing tolerances" or as "equal within ±10%" or "equal within ±5%". Another definition for equal values may be that they are equal within the precision of typical measurements.

The at least one aperture may, as an alternative to its definition by means of its cross sectional size, have a size, or be sufficiently small, or have extensions in two directions perpendicular to its depth, so that it provides at least a cutoff frequency so that incident radiation with a frequency below the first cutoff frequency is attenuated inside the at least one aperture and that incident radiation with a frequency above the cutoff frequency propagates through the at least one aperture.

The filter layer may be made of a metal layer with apertures or of a non-metal layer with apertures that have a metal coating. The filter layer may also be made of a layer of opaque material with apertures as long as there is a sufficient filter or attenuation effect for light above a certain wavelength or wavelength range. Generally, the filter layer may be configured to sufficiently filter out or attenuate light above a certain wavelength. The filter or attenuation effect does not need to be close to 100%, it may be lower, e.g. in a range from 100% to 10% so that the transmitted intensity is reduced to between 0% and 90%. Generally, the filter layer may be configured to allow for sufficient propagation of incident radiation above a certain frequency by e.g. coupling of the incident radiation to a propagating mode of the aperture. Sufficient propagation may be provided when the propagating radiation is measurably less attenuated than the radiation below the cutoff frequency. The difference between propagating radiation above the cutoff frequency and attenuated radiation below the cutoff frequency may have a rounded value in the range from 100% to 10%. This may mean that propagating radiation above the cutoff frequency may also be attenuated to a rounded value between 100% and 10% but measurably less attenuated than radiation below the cutoff frequency.

Generally, the filter layer and the at least one aperture may be configured to couple photons that hit on the filter layer in an efficient way to the one or more modes that propagate through the at least one aperture.

In the following, an example embodiment of the apertures is described first.

Two basic parameters of the apertures are the parameter describing the size of the aperture and the parameter describing the depth of the aperture (or the thickness of the first layer). The following calculation is done for apertures that are not filled with additional transparent material but a similar calculation can take into account such materials with its optical properties.

Regarding the propagation of electromagnetic waves through an empty waveguide, the following wave equation (derived from the Maxwell equation in absence of sources for vacuum) is taken as the starting point:

$$\left(\nabla^2 - \frac{1}{c^2}\frac{d^2}{dt^2}\right)\underline{f}(x, y, z, t) = 0$$

or in a different notation $$(\text{grad}^{}2 - (1/c^{}2)(d/dt)^{**}2)\underline{f}(x,y,z,t)=0.$$

Here, $\underline{f}(x, y, z, t)$ represents the electric field and the magnetic field (underlining signifies a vector).

For a general waveguide in z direction with a constant axial cross section, the following ansatz for f(x, y, z, t) is appropriate which describes waves propagating in z direction:

$$\underline{f}(x,y,z,t)=\underline{f}(x,y)ei(\omega t-k_z z).$$

With this ansatz, $\underline{f}(x, y, z, t)$ is a complex function and physical quantities such as the E-field or B-field are taken as the real part of this function.

The wave equation becomes then $$\left(\frac{d^2}{dx^2} + \frac{d^2}{dy^2} - k_z^2 + \frac{\omega^2}{c^2}\right)\underline{f}(x, y) = 0$$

or $$\left((d/dx)^{}2 + (d/dy)^{}2 - k\_z^{}2 + (w/c)^{}2\right)\underline{f}(x, y) = 0.$$

This equation together with boundary conditions derived from waveguides with a perfect conductor as walls define an eigenvalue problem for f(x, y).

The boundary conditions are for $\underline{n}$ as the normal vector of the wall surface:

$\underline{n}\cdot\underline{B}=0$ (i.e. the B-field vanishes on the wall surface in normal direction)

$\underline{n}\times\underline{E}=0$ (i.e. the E-field vanishes on the wall surface in tangential direction).

For a waveguide of rectangular shape with width a and height b in x and y direction respectively, it is common to use the plane wave function that is appropriate for such a geometry $$\underline{f}(x,y,z,t)=\underline{f}\_0\ \exp(i(wt-k\_x^*x-k\_y^*y-k\_z^*z)).$$

From the wave equation follows then $$(w/c)^{}2=k\_x^{}2+k\_y^{}2+k\_z^{}2.$$

From the boundary conditions follows the result for the wave numbers $$k\_x=n\pi/a \text{ and } k\_y=m\pi/b.$$

From this follows for the wave number in z direction $$k\_z^{}2=((w/c)^{}2-(n\pi/a)^{}2-(m\pi/b)^{}2) \text{ or}$$

$$k\_z=\text{sqrt}((w/c)^{}2-(n\pi/a)^{}2-(m\pi/b)^{**}2).$$

This means that for waves propagating in z direction (e.g. not decaying exponentially), the frequency w has to be greater than the smallest cut-off frequency w_cut-off=c sqrt $((n\pi/a)^{}2+(m\pi/a)^{}2)$ which is for a>b (and n=1, m=0)

$$w\_\text{cut-off}=c(\pi/a).$$

The propagating modes can now be classified into two main mode types: (i) the transverse electric modes (TE_m,n) for which E_z=0 (i.e. the electric field is always pointing in directions transverse to the propagating direction) and (ii) the transverse magnetic modes (TM_m,n) for which B_z=0 (i.e. the magnetic field is always pointing in directions transverse to the propagating direction). There are also the transverse electromagnetic modes (TEM) for which E_z=0 and B_z=0 (i.e. the electric field and magnetic field are always pointing in directions transverse to the propagating direction) which however, requires waveguides with at least two electrically insulated conducting walls.

For waveguides with a square cross section (i.e. a=b), it follows $$k\_z=\text{sqrt}((w/c)^{}2-(n^{}2+m^{}2)(\pi/a)^{}2).$$

As shown in the textbook "Classical Electrodynamics" from J. D. Jackson, sixth printing 1967, the TE modes have always the lowest cut-off frequency of w_cut-off=c (π/a) while the TM modes have a higher cut-off frequency.

Waveguides with a square cross section have two discrete TE modes with the same cut-off frequency, that is, the TE_1,0 and the TE_0,1 modes. As a consequence, such waveguides are multiple mode waveguides which may provide the advantage of coupling photons that hit the opening of the waveguide more efficiently to the modes of the waveguide so that the waveguides are more transparent to radiation or light that is above the cut-off frequency.

Other effects that may be related to walls made of non-perfect conductors may be neglected here because the length of the waveguides considered here is very short (e.g. below 10 µm or below 1 µm).

For square waveguides, the two minimal modes (n=1, m=0 and n=0, m=1) give $$k\_z^{}2=(w/c)^{}2-(\pi/a)^{**}2.$$

For non-propagating modes of the waveguide, that is, modes with an angular frequency less than cut-off frequency w<w_c=c (π/a) the solution for k_z is purely imaginary and leads to an exponential decay of the wave in z-direction $$k\_z=-i\ \text{sqrt}((\pi/a)^{}2-(w/c)^{}2), \text{ for } w<c(\pi/a) =-i(\pi/a)\text{sqrt}(1-(2a/\lambda)^{**}2), \text{ for } \lambda>2a, (*)$$

wherein λ=2πc/w is the wavelength of the electromagnetic (em) wave and λ_c=2a the cut-off wavelength. The equation (*) is a fundamental equation indicating that, when the wavelength of the em wave is above the cut-off wavelength, the propagation in waveguide direction is exponentially decaying as indicated by k_z.

The above equations for k_z are approximately true for empty waveguides. For waveguides filled e.g. with dielectric material, it is e.g.

$$k\_z=-i\ \text{sqrt}((\pi/a)^{}2-(\mu\varepsilon)/(\mu\_0\varepsilon\_0)(w/c)^{}2),$$

for w<c(π/a)sqrt(µ_0ε_0)/(µε),
with ε being the dielectric constant of the dielectric and transparent material in the waveguide and p being its permeability. ε_0 and µ_0 are the corresponding constants for the vacuum.

The equation (*) is now used to design example apertures so that visible light between the wavelength of 400 nm and 700 nm is separated into three components representing blue light, green light, and red light.

The largest aperture is configured to allow propagation of all visible light but suppress light (infrared light) above 700 nm. It follows a_1=350 nm.

The medium sized aperture is configured to allow propagation of blue and green light (and yellow light) but suppress red light above 600 nm. It follows a_2=300 nm.

The smallest aperture is configured to allow propagation of blue light but suppress green and red light above 500 nm. It follows a_3=250 nm.

In other embodiments, the values for the cutoff frequencies may be different in order to separate the visible light into different components. As an example, the medium sized aperture may be selected to allow propagation of blue and green light and suppress yellow and red light above 570 nm. It then follows a_2=285 nm.

The light intensity S is proportional to the square of the electric field of the em wave: S prop (Re f)**2.

The apertures can now be designed so that e.g. light with a wavelength λ_D that is 100 nm larger than the cut-off wavelength (λ_D=λ_c+100 nm) is at least reduced by a factor of exp (−2)≈0.135. This means that the electric field is reduced by a factor of exp (−1). This gives a minimum depth I_z of the aperture $$I\_z=(a/\pi)/\text{sqrt}(1-(2a/\lambda\_D)^{**}2).$$

From this follows for the largest aperture (which determines the minimal thickness of the first layer) with a=a_1=350 nm:

$$I\_z\approx 230 \text{ nm}.$$

If it is desired to reduce the light intensity for light with a wavelength λ_D (λ_D=λ_c+100 nm) at least by a factor of exp (−4)≈0.018, this gives a minimum depth I_z' with a=a_1.

$$I\_z'\approx 460 \text{ nm}.$$

The calculated I_z' value provides quite a strong color separation (which is even stronger for light with smaller wavelengths).

Embodiments with a thickness of the first layer as specified by I_z or I_z' are readily fabricated with standard chip fabrication processes: a metal layer with a thickness of e.g. 460 nm can be deposited on top of a naked image sensor (i.e. an image sensor without a color filter array) of possibly conventional design with pixels that have a pixel pitch of around 1 to 10 micrometers (or less or more). The apertures in the first layer may then be provided by using e.g. an etching process. In this way, the pixels are directly coupled to apertures in the metal layer. The apertures may have sizes of 350 nm, 300 nm, and 250 nm. All of the required fabrication steps are readily available with today's technology.

A thicker first layer allows for a stricter reduction of light with wavelengths that are greater than the cut-off wavelength defined by the aperture size. Therefore, a thicker first layer increases the color separation. Accordingly, a thinner layer decreases the color separation between the different light components. Depending on the application the color separation may be implemented in stricter way or in a less strict way.

In a further embodiment, the thickness of the first layer may also vary for different apertures.

In a further embodiments, the shape of the apertures may be e.g. conical or tapering (that is have larger opening at the one side than at the other side of the filter layer) and the cross section of the apertures may be non-rectangular, such as round, hexagonal, or any other shape.

Generally, it may be desirable to increase the surface of the image chip which can be used for light measurements as much as possible so that light collection efficiency is increased. As a consequence, as many apertures may be coupled to light sensitive areas of the light sensitive layer as possible and the thickness of the walls between the apertures may be as thin as possible.

For example, assuming that the light sensitive area of an image sensor with a pixel pitch of around 1 micrometer is 800 nm times 800 nm, one embodiment may group four apertures of the same size together and couple the four apertures directly to one pixel. In this way, the light loss is reduced. It may also be possible that four apertures of the same size (e.g. 350 nm) are coupled to one pixel and nine smaller apertures of the same (e.g. 250 nm) are coupled to another pixel.

Generally, the number of apertures coupled to one pixel may vary in accordance with the pixel size, the aperture size, and the wall thickness. As an example, square pixels of a size of 4 μm may have the following number of square apertures where the metallic walls have a thickness of around 50 nm: For square apertures with a=350 nm, there may be 9*9 or 10*10 apertures per pixel; with a=300 nm, there may be 11*11 apertures per pixel; with a=250 nm, there may be 13*13 apertures per pixel. In a further example, the pixels may have a side length of less than 1 μm and for each pixel, there may be a single aperture coupled to the pixel.

In an embodiment, the apertures may have a constant, square cross section with a side length value $a_i$ (i=1 ... n) for n different sizes with $a_1 > a_2 > a_3 > \ldots > a_n$. The apertures may have metallic walls and the cutoff frequency may have a corresponding cutoff wavelength $\lambda_{i,\ cut\text{-}off}$ above which the incident radiation decays exponentially inside the at least one aperture and below which the incident radiation propagates through the aperture of the aperture and wherein $a_i$ is equal to $\lambda_{i,\ cut\text{-}off}/2$. The thickness $I_z$ of the first layer, which in this example corresponds to the depth d of the apertures, is for vacuum in the apertures $$l_{z,vac} = d\_vac \geq \left(\frac{a_1}{\pi}\right)\frac{1}{\sqrt{1-\left(\frac{2a_1}{\lambda_{D,1}}\right)^2}}$$

or $$l\_z, vac = d\_vac \geq (a\_1/\pi)/sqrt(1-(2a\_1/\lambda\_D, 1)^{**}2)$$

wherein a_1 is the largest side length value of the side length value $a_i$ (i=1 ... n) and $\lambda\_D,1 = \lambda_{D,1}$ is a wavelength which is greater than the cut-off wavelength $\lambda_{1,\ cut\text{-}off} = 2a_1$ and which is the wavelength of radiation the intensity of which is attenuated at least by a factor of $e^{-2}$. In other words, if the filter layer has a depth d that is in accordance with the above formula intensity of radiation with wavelength $\lambda\_D,1$ is attenuated inside the at least on aperture by a factor of at least $e^{-2}$. Radiation with a wavelength between $\lambda\_D,1$ and $\lambda_{1,\ cut\text{-}off}$ will be attenuated less and radiation below $\lambda\_D,1$ will be attenuated even more but with the above formula it is possible to determine a depth which provides a certain level of attenuation. In an example, $\lambda\_D,1$ may be selected to be 100 nm greater than $\lambda_{1,\ cut\text{-}off}$ for a relatively low level of attenuation or less sharp filtering characteristic (see example above). In a further example, $\lambda\_D,1$ may be selected to be 25 nm greater than $\lambda_{1,\ cut\text{-}off}$ for a relatively high level of attenuation or sharper filtering characteristic.

The above equation for I_z,vac or d_vac are valid for absolutely empty apertures, for apertures in which there is no vacuum or which are filled with matter such as dielectric material or air, it is $$l_z = d \geq \left(\frac{a_1}{\pi}\right)\frac{1}{\sqrt{1-\left(\frac{2a_1}{\lambda_{D,1}}\right)^2}}$$

or $$l\_z = d \geq (a\_1/\pi)(1/sqrt(1-(2a\_1/\lambda\_D, 1)^{**}2)),$$

wherein the wavelengths $\lambda_{D,1}$ and $\lambda_{i,\ cut\text{-}off}$ (i=1 ... n) are the wavelengths of the incident radiation in the matter.

Accordingly, a first aspect may relate to an image sensor for recording incident radiation. The image sensor may include a first layer for filtering the incident radiation and a second light-sensitive layer for absorbing and recording the radiation passing through the first layer. The first layer may be made of one or more materials that are opaque for the incident radiation. In an example, the first layer may be considered as being opaque for the incident radiation because the incident radiation couples to one or more modes which are provided by the at least one aperture and which, depending on the frequency of the incident radiation, lead to an attenuation of the incident radiation (or the energy of the incident radiation) or to a propagation of the incident radiation (or the energy of the incident radiation). The first layer (or filter layer) precedes the second light-sensitive layer in a direction of propagation of the incident radiation and the first layer includes at least one aperture passing through the first layer to the second layer for propagating radiation therethrough. The cross sectional size of the at least one aperture may be configured to provide a cutoff frequency so that incident radiation with a frequency below the cutoff frequency is attenuated inside the at least one aperture and that incident radiation with a frequency above the cutoff frequency propagates through the at least one aperture. In other words, the at least one aperture provides a cutoff frequency and incident radiation with a frequency below the cutoff frequency is attenuated inside the at least one aperture and incident radiation with a frequency above the cutoff frequency propagates through the at least one aperture. Thus, the at least one aperture filters the incident radiation by attenuating incident radiation with a frequency below a cutoff frequency provided by the at least one aperture and by allowing propagation of incident radiation with a frequency above the cutoff frequency through the at least one aperture. The terms cutoff frequency, attenuated or decaying, and propagate may be used as in the field of waveguides. Accordingly, incident radiation with a frequency below the cutoff frequency may decay exponentially inside the at least one aperture and incident radiation with a frequency above the cutoff frequency may propagate through the at least one aperture by coupling to one or more propagating modes inside the at least one aperture. In an embodiment, incident radiation with a frequency above the cutoff frequency may also decay exponentially but this decay is not predicted by waveguide theory and instead may be caused by other reasons (e.g. non-ideal conductors as walls or other real world effects). As indicated previously, the term cutoff frequency as used here may mean cutoff frequency range (instead of only one cutoff frequency value as predicted by waveguide theory). In this case, incident radiation with a frequency below the cutoff frequency range is attenuated inside the at least one aperture and incident radiation with a frequency above the cutoff frequency range propagates through the at least one aperture.

In an embodiment, the at least one aperture may be perpendicular to the plane surface of the first layer, wherein the at least one aperture has a constant cross section along the axis of the aperture and the cross section is symmetric, optionally a square, rectangular, circular, or hexagonal cross-section. The first layer may be metallic or the first layer may include a non-metallic layer that is coated with a metallic layer so that in both cases, the at least one aperture has one or more metallic walls. Optionally, all walls of the at least one aperture may be metallic.

In an embodiment, the first layer may include two, three or more apertures of different cross sectional sizes $cs_i$ ($i=1 \ldots n$), with $cs_1 > cs_2 > cs_3 \ldots 22\ cs_n$. Each aperture may be configured to attenuate light having a frequency below respective cutoff frequencies $w_1, w_2, w_3, \ldots, w_n$ and to propagate light having a frequency above respective cut-off frequencies, wherein $w_1 < w_2 < w_3 \ldots < w_n$. In other words, cross sectional size $cs_1$ is configured to provide cutoff frequency $w_1$, cross sectional size $cs_2$ is configured to provide cutoff frequency $w_2$ etc.

In an embodiment, the at least one aperture may be filled with a transparent material and optionally, the transparent material may provide an additional protective layer on the first layer.

In an embodiment, the at least one aperture may have a constant, square cross section with a side length value $a_i$ ($i=1 \ldots n$) for n different sizes. The at least one aperture may have metallic walls and the cutoff frequencies may have corresponding cutoff wavelengths $\lambda_i$, cut-off ($i=1 \ldots n$) above which the incident radiation decays exponentially inside the at least one aperture and below which the incident radiation propagates through the at least one aperture. The side length value $a_i$ may be equal to $\lambda_i$, cut-off/2 ($i=1 \ldots n$). Optionally, the thickness $I\_z$ of the first layer or the depth d of the at least one aperture may be $$I\_z = d \geq (a\_1/\pi)(1/\mathrm{sqrt}(1-((2a\_1)/\lambda\_(D,1))^{**}2)),$$

wherein a1 is the largest side length value of the $a_i$ ($i=1 \ldots n$) and $\lambda\_(D,1)$ is a wavelength which is greater than the cut-off wavelength $\lambda_1$, cut-off$=2a_1$ and which is the wavelength of radiation the intensity of which is attenuated inside the at least one aperture by a factor of at least $e^{**}(-2)$ when reaching the second light-sensitive layer. The wavelengths $\lambda\_(D,1)$ and $\lambda_{i,\ cut-off}$ ($i=1 \ldots n$) are the wavelengths of the incident radiation in vacuum when there is vacuum in the apertures and when there is matter in the apertures which has $\varepsilon$ as the dielectric constant and $\mu$ as the permeability, the wavelengths $\lambda\_(D,1)$ and $\lambda_{i,\ cut-off}$ ($i=1 \ldots n$) are the wavelengths of the incident radiation in the matter. The matter in the apertures may be for example air, dielectric and transparent matter, or also vacuum (in which case the factor sqrt $((\mu\_0\varepsilon\_0)/(\mu\varepsilon))$ becomes one).

In an embodiment, the light-sensitive layer may include an array of pixels and each aperture or each plurality of contiguous apertures with the same cross sectional size overlies and is coupled to an individual pixel of the array. In an embodiment, each pixel may include a light-sensitive area and the aperture or the plurality of contiguous apertures coupled to the pixel may cover an area that is equal to or larger than the light-sensitive area of the individual pixel and that is smaller than the whole area of the pixel.

The image sensor may have different arrays of pixels. In an example, the array may have one or very few pixels, in a different example the array may 4000 times 6000 pixels or many more pixels such as 100 million pixels (or more) or any number of pixels in between. The array may also have 1 times 8000 pixels or 3 times 8000 pixels when the image sensor is used e.g. in a scanning device. Again, the number of pixels may be much larger or much smaller.

In an embodiment, the light sensitive layer of the image sensor may be similar or identical to a light sensitive layer of a conventional image sensor. The image sensor for recording incident radiation according to an embodiment may be similar to a conventional image sensor as far as the circuitry is concerned. In other words, the image sensor according to an embodiment may be similar to a conventional image sensor of which the conventional color filter array with colored filter elements has been replaced by a first layer according to an embodiment.

In an embodiment, a transparent layer may be located between the first layer and the light-sensitive layer. Optionally, the transparent layer may include walls located above boundaries of individual pixels, wherein the walls are opaque for the incident radiation and preferably metallic.

In an embodiment, the first layer may include an array of apertures that have two or more different cross sectional sizes. Each aperture of the array may have a constant, square cross section with a side length value $a_i$ ($i=1 \ldots n$) for n different sizes and each aperture may have metallic walls. The apertures may be grouped so that each group of apertures has one aperture or more than one aperture that are contiguous and have the same cross sectional size and each group of apertures overlies and is coupled to one and only one pixel of the light sensitive layer. The groups of apertures may be arranged in a repeating pattern in the first layer.

In an embodiment, the apertures may have three or more different cross sectional sizes: a first size to filter out infrared light and allow for propagation of red, green, and blue light, a second size to filter out red light and allow for propagation of green and blue light, and a third size to filter out red and green light and allow for propagation of blue light. The repeating pattern in the first layer may be configured to provide a measured or interpolated value for red, green, and blue light for each pixel of the array of pixels. Optionally, the cut-off wavelength $\lambda\_(1)$ corresponding to the cutoff frequency of the first cross sectional size is in the range of 600 nm to 750 nm, optionally in the range of 650 nm to 730 nm and the side length value a1 of the first cross sectional size is in the range of 300 nm to 375 nm, optionally in the range of 325 nm to 365 nm, wherein the cut-off wavelength $\lambda\_(2)$ corresponding to the cutoff frequency of the second cross sectional size is in the range of 495 nm to 590 nm, optionally in the range of 515 nm to 570 nm and the side length value a2 of the second cross sectional size is in the range of 247 nm to 295 nm, optionally in the range of 257 nm to 285 nm, and wherein the cut-off wavelength $\lambda\_(3)$ corresponding to the cutoff frequency of the third cross sectional size is in the range of 450 nm to 510 nm, optionally in the range of 465 nm to 495 nm and the side length value a3 of the third cross sectional size is in the range of 225 nm to 255 nm, optionally in the range of 233 nm to 248 nm.

In an embodiment, the first layer may include an array of apertures that have three or more different cross sectional sizes: a first size to allow for propagation of infrared, red, green, and blue light; a second size to filter out red light and allow for propagation of green and blue light; and a third size to filter out red and green light and allow for propagation of blue light. Each aperture of the first size may overlie a region of a pixel that is equal to or smaller than the pixel and each aperture of the first size may be filled with a filter material that filters out infrared light and transmits light with a shorter wavelength than infrared light. Optionally, all apertures are filled with the filter material and/or the filter material provides an additional layer on the first layer. In this embodiment, the largest apertures are so large that they do not provide a filter function by e.g. filtering out infrared light. Instead, the infrared light is filtered out by an additional colored filter material as it may be used for conventional image sensors. Such an embodiment may be more effective for collecting light of all frequencies that is recorded in the pixels coupled to the largest apertures.

In an embodiment, the array of apertures may have three different cross sectional sizes and the groups of apertures may be arranged in two alternating rows of pixels. The first row of pixels may measure alternately red, green, and blue light in one pixel and green and blue light in the next pixel and the second row of pixels may measure alternately green and blue light in one pixel and blue light in the next pixel. A pixel of the first row measuring red, green, and blue light may have an adjacent pixel in the second row that measures green and blue light.

In an embodiment, the apertures may have any one of the following further sizes: a fourth size to filter out a portion of far infrared light below an infrared light cutoff frequency and allow for propagation of a further portion of near infrared light above the infrared light cutoff frequency as well as propagation of red, green, and blue light; a fifth size to filter out red and yellow light and allow for propagation of green and blue light; a sixth size to filter out red light and a portion of green light below a green light cutoff frequency and allow for propagation of a further portion of green light above the green light cutoff frequency and propagation of blue light; a seventh size to filter out red, green, and blue light and allow for propagation of ultraviolet light; or a combination of any of the sizes.

In an embodiment, the apertures may have two or more different cross sectional sizes that comprise one size to filter out light below a lower cutoff frequency and allow for propagation of light above the lower cutoff frequency and another size to filter out light below a upper cutoff frequency and allow for propagation of light above the upper cutoff frequency so that the amount of light in the range between the lower cutoff frequency and the upper cutoff frequency is measurable in addition to other components of light. Optionally, the range between the lower cutoff frequency and the upper cutoff frequency may include one or more spectral lines, optionally absorption or emission lines of atoms or molecules identifying a transition between different states of the atoms or molecules.

In an embodiment, the at least one aperture may be elongated, preferably rectangular in cross-section, so that the length of the at least one aperture in the elongated direction defines the cutoff frequency for incident radiation that is polarized perpendicularly to the elongated direction and the length of the at least one aperture in the direction perpendicular to elongated direction defines a further cutoff frequency that is greater than the upper limit of the range of incident radiation that is desired to be analyzed by the image sensor. Optionally, the first layer may include a plurality of first elongated apertures overlying a first pixel of an array of pixels of the light-sensitive layer and a plurality of second elongated apertures overlying an adjacent second pixel and having a cross-sectional shape rotated by 90° with respect to the first elongated apertures around the axis of the second elongated apertures.

In an embodiment, the at least one aperture may be tapering towards or away from the second layer.

FIG. 1 is a cut sectional view of an image sensor 10 according to an embodiment. The image sensor 10 has a first layer 11 for filtering incident radiation and a second light-sensitive layer 12 for absorbing the radiation passing through the first layer. The second light-sensitive layer 12 includes an array of pixels of which only pixel $14_{n,m}$ is shown. The pixel $14_{n,m}$ is coupled to 5 times 5 apertures 13 but depending on the size of the pixel, the apertures, and the walls, other numbers of apertures per pixel are also possible. In the embodiment, the apertures 13 are perpendicular to the plane surface of the first layer 11, have a constant, square cross section along the axis of the aperture, and have all the same size to provide one cut-off frequency for the pixel $14_{n,m}$. The apertures 13 pass through the first layer 11 to the second layer 12 so that radiation above the cutoff frequency provided by the apertures 13 can propagate through the apertures 13 and be measured in the light sensitive second layer 12. In contrast to this, radiation below the cutoff frequency is attenuated inside the apertures 13 and will contribute only a small part to the radiation that is measured in the second layer 12. By changing the thickness of the first layer 11, the intensity of the radiation below the cutoff frequency that reaches the second layer can be controlled so that it can be made as small as desired (until it reaches practically zero). The apertures 13 have metal walls 20 and function as waveguides. Incident radiation below the cutoff frequency is attenuated inside the apertures 13 by decaying exponentially inside the apertures 13 while incident radiation above the cutoff frequency propagates through the apertures 13 by coupling to one or more propagating modes inside the apertures 13. In the embodiment, the cutoff wavelength that corresponds to the cutoff frequency is twice the side length of the square cross section of the apertures 13.

In FIG. 1, a plurality of 5 times 5 contiguous apertures 13 with the same cross sectional size overlies and is coupled to the individual pixel $14_{n,m}$ of the array. Other pixels of the array may be coupled to a further plurality of contiguous apertures with a square cross section but with a different cross sectional size.

The filter layer 11 may be fabricated above light-sensitive layer 12 that may be of conventional design. The filter layer 11 may be fabricated using standard CMOS technology or other chip manufacturing technology by providing a metal layer of sufficient thickness into which the apertures 13 are then manufactured. In an embodiment, apertures may be manufactured in a similar way as for example zero mode waveguides used for single molecule sequencing (see US patent publication US 2014/0175052 A1 which is incorporated herein by reference). The filter layer 11 may also be manufactured by providing a dielectric layer over the image sensor, removing portions of the dielectric layer to create the apertures 13 and then covering the walls 20 at the sides and on the top with a metallic layer (see e.g. international publication WO 2013/109877 which is incorporated herein by reference).

Figure 2A:
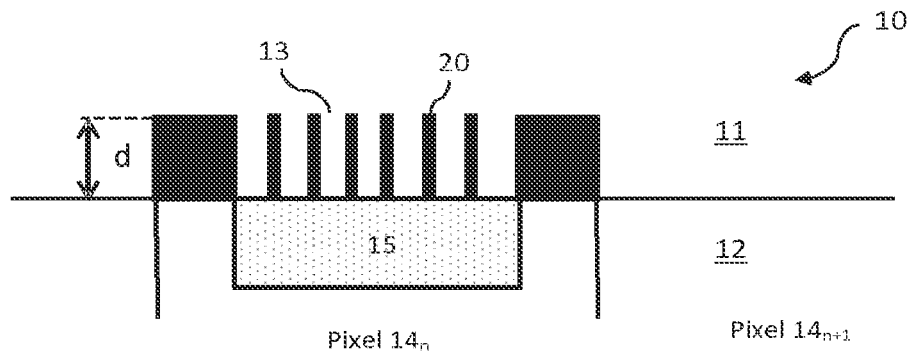
FIG. 2A is a schematic sectional view of a pixel of an image sensor according to an embodiment in which a first layer is provided on a light-sensitive layer of the image sensor.

FIG. 2A is a schematic sectional view of a pixel of an image sensor 10 according to an embodiment in which a first layer 11 for filtering incident radiation with through-apertures is provided on a second light-sensitive layer 12 of the image sensor 10. As shown, the first layer 11 is disposed above and in contact with the second light sensitive layer 12 which absorbs the radiation passing through the filter layer 11. The filter layer 11 has apertures 13 with walls 20 for propagating radiation above the cutoff frequency therethrough. The thickness of the first layer 11 and accordingly the depth of the apertures 13 is d.

The light-sensitive layer 12 comprises an array of pixels 14$_n$, 14$_{n+1}$, ... and each aperture 13 overlies and is coupled to an individual pixel of the array. Each pixel 14 comprises a light sensitive area 15, and the apertures 13 may be—as shown in non-limiting manner—only above the light sensitive area 15 of the pixels so that light that cannot be measured is blocked from reaching the image sensor. This may reduce stray light that can reach neighboring pixels so that no or less light shielding between the pixels in the light sensitive layer is required.

Figure 2B:
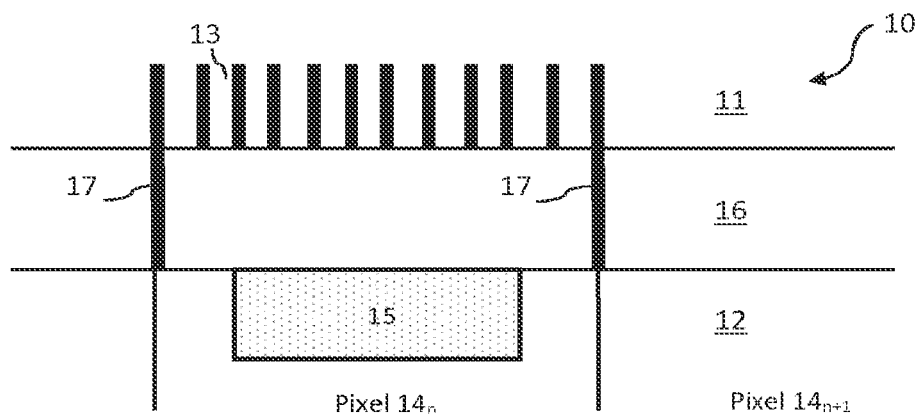
FIG. 2B is a schematic sectional view of a pixel of an image sensor according to an embodiment in which a first layer is provided on a light-sensitive layer of the image sensor and in which a transparent layer is interposed between the first layer and the light-sensitive layer.

FIG. 2B is a schematic sectional view of a pixel of an image sensor 10 according to an embodiment in which a first layer 11 having through-apertures is provided on a second light-sensitive layer 12 of the image sensor and in which a transparent layer 16 is interposed between the first layer 11 and the second light-sensitive layer 12. In this embodiment, the transparent layer 16 is introduced between the light-sensitive layer 12 and the filter layer 11 to allow for an increase of the area that collects light that is measured. The filter area in the first layer 11 that is coupled to the pixel 14$_n$ is larger than the light sensitive area 15 of the pixel 14$_n$, it is substantially as large as the area of the pixel 14$_n$ itself. Walls 17 may be provided in correspondence with the pixel limits, e.g. above boundaries between adjacent pixels. In the embodiment, the apertures 13 cover an area that is larger than the sensitive area in order to maximize light collection. In an embodiment, the aperture coupled to one pixel may cover as much area of the pixel as possible considering the size of the apertures, the walls, and the pixel.

The walls 17 of transparent layer 16 may be opaque (i.e. non-transparent to light) or metallic and are located over the pixel limits to prevent light crossing over from one pixel area 14$_n$ to another pixel area 14$_{n+1}$. The transparent layer 16 with the walls 17 may be manufactured by first providing an opaque or metallic layer that is removed over the pixel areas so that only the walls 17 remain and then by providing the transparent dielectric material of transparent layer 16.

Figure 2C:
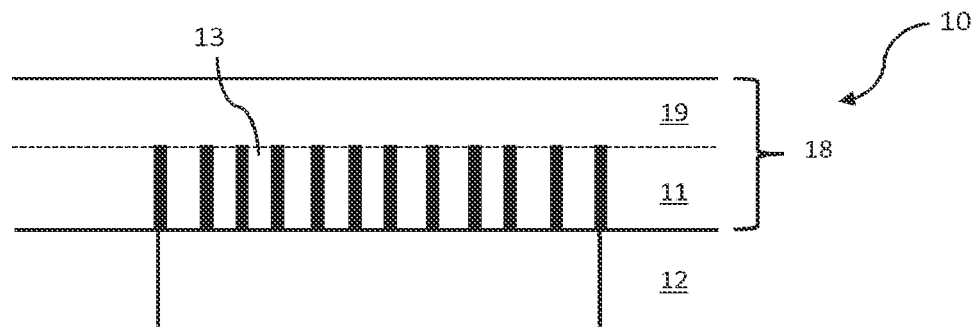
FIG. 2C is a schematic sectional view of a pixel of an image sensor according to an embodiment in which a first layer is provided on a light-sensitive layer of the image sensor and in which transparent material is filled in the apertures of the first layer and the transparent material further provides a transparent protective layer on the first layer.

FIG. 2C is a schematic sectional view of a pixel of an image sensor 10 according to an embodiment in which a first layer 11 having through-apertures is provided on a light-sensitive layer 12 of the image sensor 10 and in which transparent material 18 is filled in the apertures 13 of the filter layer 11 and the transparent material 18 further provides a transparent protective layer 19 on the filter layer 11. In the embodiment, the transparent material 18 has a thickness that is greater than the thickness of the filter layer 11 to provide an additional layer 19 over the filter layer with the apertures. The additional layer 19 may be a protective layer. In a further embodiment, the apertures 13 of the filter layer 11 may be filled with a transparent material 18 that has the same thickness as the thickness of the filter layer 11. In embodiments with transparent material, calculations relating to cutoff frequencies may have to take into account the dielectric properties of the transparent material 18.

Figure 3A:
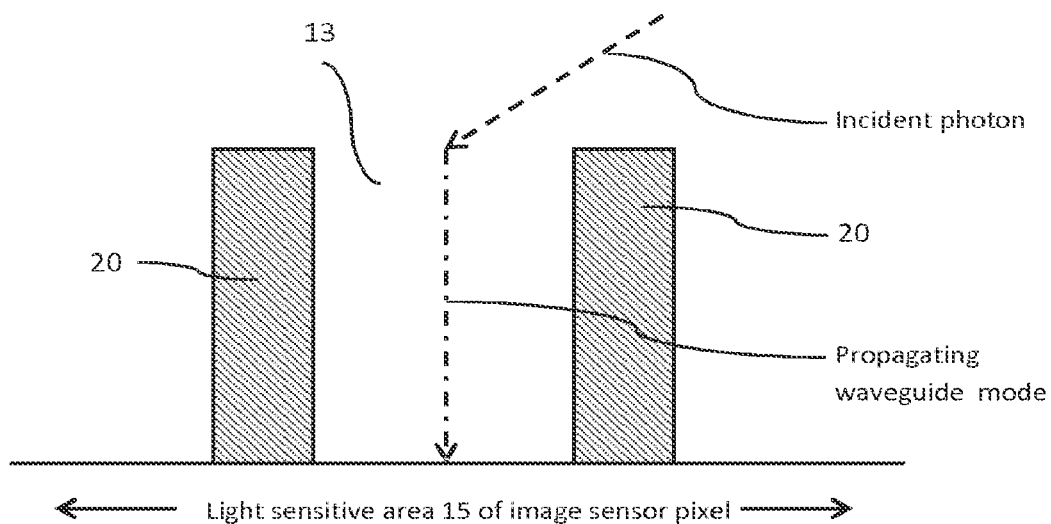
FIG. 3A is a schematic sectional view of an interaction of an image sensor with incident radiation according to an embodiment with empty apertures.
Figure 3B:
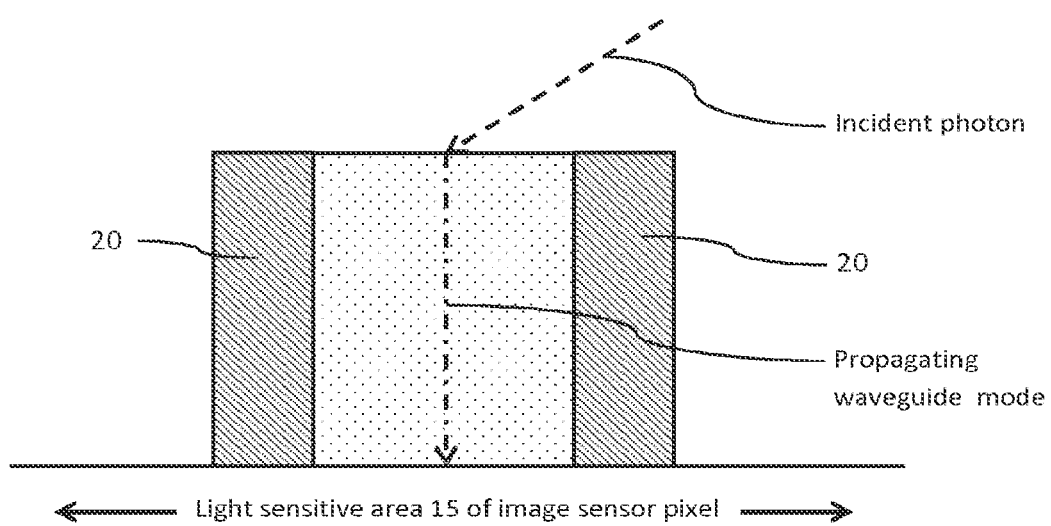
FIG. 3B is a schematic sectional view of an interaction of an image sensor with incident radiation according to an embodiment with filled apertures.
Figure 3C:
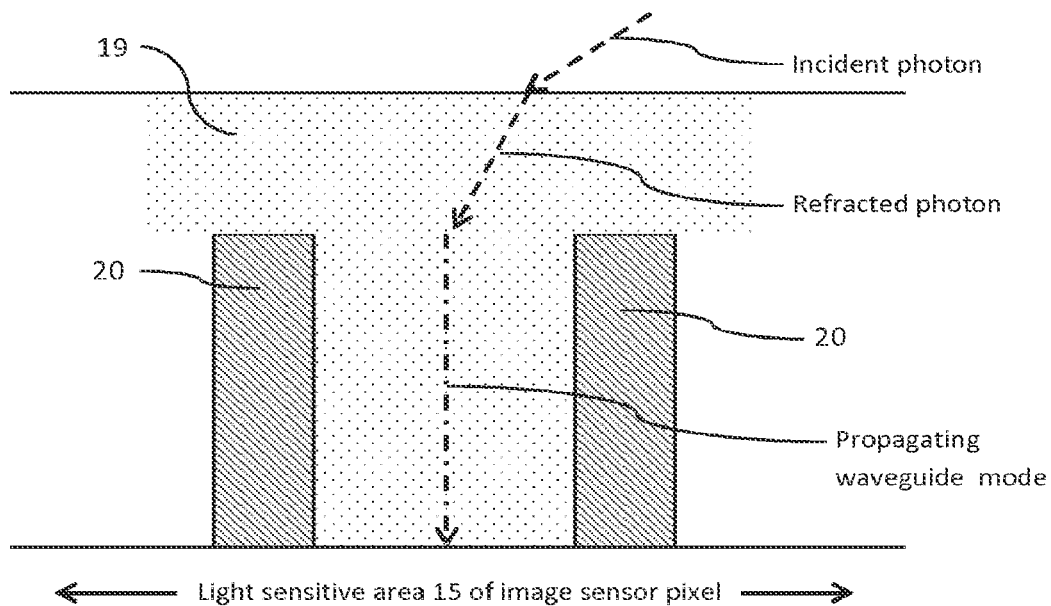
FIG. 3C is a schematic sectional view of an interaction of an image sensor with incident radiation according to an embodiment with filled apertures and a transparent protective layer.

FIGS. 3A to 3C schematically show the interaction of an incident photon with an individual aperture 13 for the cases discussed above and shown in FIGS. 2A and 2C. Each of the apertures 13 in these examples has metallic walls 20.

FIG. 3A is a schematic sectional view of an interaction of an incident photon with an image sensor according to an embodiment with empty apertures. In FIG. 3A, the aperture 13 is empty, that is, not filled with a transparent material, corresponding to the example shown in FIG. 2A. The incident photon impinges, e.g. under an oblique incidence angle, upon the aperture 13, and if its frequency is sufficiently large for the size of the aperture 13, a propagating waveguide mode will exist in the aperture. The photon or the energy of the photon will thus be able to reach the underlying light sensitive area of the image sensor pixel.

FIG. 3B is a schematic sectional view of an interaction of the image sensor with incident radiation according to an embodiment with filled apertures. In FIG. 3B, the aperture is filled with a transparent material, corresponding to an example in FIG. 2C in which the thickness of the transparent material 18 is equal to the thickness of the filter layer 11. In other words, the apertures of the filter layer are filled with transparent material up to the upper edge of the walls of the apertures. As in the case of FIG. 3A, the incident photon, which may arrive under an oblique, i.e. non-normal incidence angle, enters the aperture but only if its frequency is sufficiently large for the size of the aperture a waveguide mode will be available for propagating the energy of the photon (or a portion of it) down to the light-sensitive layer of an image sensor.

FIG. 3C is a schematic sectional view of an interaction of the image sensor with incident radiation according to an embodiment with filled apertures and a transparent protective layer 19. In FIG. 3C, the transparent material is applied to the filter layer 11 in such way that the aperture is filled with the transparent material and there is a transparent protective layer 19 on top of the filter layer 11. In this case, the incident photon is first refracted, before it enters the aperture. Again, only if its frequency is sufficiently large a propagating waveguide mode will be available so that the energy of the photon can reach the underlying light-sensitive layer or area of the image sensor without being attenuated in a substantial way.

In a further embodiment, transparent material may be provided above each aperture the filter layer 11 in form of a microlens (e.g. with a convex upper surface) so that incident radiation is focused in the center of each aperture. Such microlenses may be used for embodiments in which the apertures are not filled and for embodiments in which the apertures are filled with transparent material. In the second case, the transparent material of the microlenses may be the same as the transparent material with which the apertures are filled or the transparent materials may be different. Embodiments with microlenses may provide a better coupling of the incident radiation to the propagating modes so that the recording efficiency of the image sensor is increased.

In yet another embodiment, multispectral images may be provided by using a filter array with apertures with more than 3 different sizes. In an example, apertures larger than 350 nm may also be used in order to measure infrared light and distinguish it from the other colors that are measured. In an example, apertures smaller than 250 nm may be used in order to measure UV light and distinguish it from the other colors that are measured. Furthermore, apertures with sizes between 250 nm and 350 nm may be used to measure light within more narrow frequency bands. If light of a narrow band is to be measured, it may be advantageous to place pixels that measure light above and below a limit of the narrow band in close proximity, e.g. as neighboring pixels. This may increase the spatial resolution of the system with respect to light of the narrow band. Generally, such embodiments may have an advantage over standard color filter arrays such as Bayer filters because the different cut-off frequencies can be defined at arbitrary values without depending on available dyes for light filtering. Also, the cut-off frequencies may provide sharp limits of light that is measured (e.g. light above the cutoff frequency) in contrast to light that is not measured (e.g. light below the cutoff frequency) by adjusting the depth of the filter layer. The way of manufacturing is always similar, only the mask for creating the apertures may have to be changed and this can be done using standard CMOS technologies or other standard chip manufacturing technologies.

In a further embodiment of the invention, the polarization of light may be measured by using non-square apertures, that is, apertures that are longer in one direction than in the other direction. In an embodiment, the length in the longer direction may be used to provide the filtering function by defining the cut-off frequency while the length in the shorter direction may be selected as so small that its cut-off frequency is higher than the range of radiation that is desired to be measured (e.g. in the UV frequency range above the blue light range). In the embodiment, the higher cutoff frequency is not used to separate a light component or frequency range but to suppress all light that is desired to be measured and that is polarized along the long side of the aperture. In the embodiment, the waveguides provided by the apertures may be effectively single mode TE waveguides and only modes with an electric field vector perpendicular to the long side of the aperture (and perpendicular to the axis of the aperture, that is, perpendicular to the normal vector of the filter layer) may propagate through apertures (the electric field vector would vary in length along the long side of the aperture). The long side of the apertures may be varied to define different cutoff frequencies for light with an electric field vector perpendicular to the long side of apertures and therefore, different color ranges with such a polarization may be measured and distinguished. In such embodiments, light polarized in the same direction as the single TE mode would couple efficiently to the only propagating mode while light polarized in a direction perpendicular to the single TE mode would couple much less efficiently to the only propagating mode and thus, be filtered out irrespective of the frequency (assuming that the short side of the apertures is sufficiently small so that measured light is below the cutoff frequency of the short side). In an embodiment, the apertures may be rectangular and have metallic walls.

Pixels with such elongated apertures may have adjacent pixels with apertures of the same size but rotated by 90 degrees. In an example embodiment, two adjacent pixels may be used to separately measure the amount of light above the same cut-off frequency and for each of the two polarization directions. In a further example embodiment, a first pair of adjacent pixels may have apertures of a first size but rotated by 90 degrees for different pixels of the first pair and a second pair of pixels may be adjacent to the first pair and have apertures of a second size but again rotated by 90 degrees for different pixels of the second pair. In such an embodiment, light of two different frequency ranges (and thus also of a range between the two different cutoff frequencies) and different polarizations may be measured.

Figure 4:
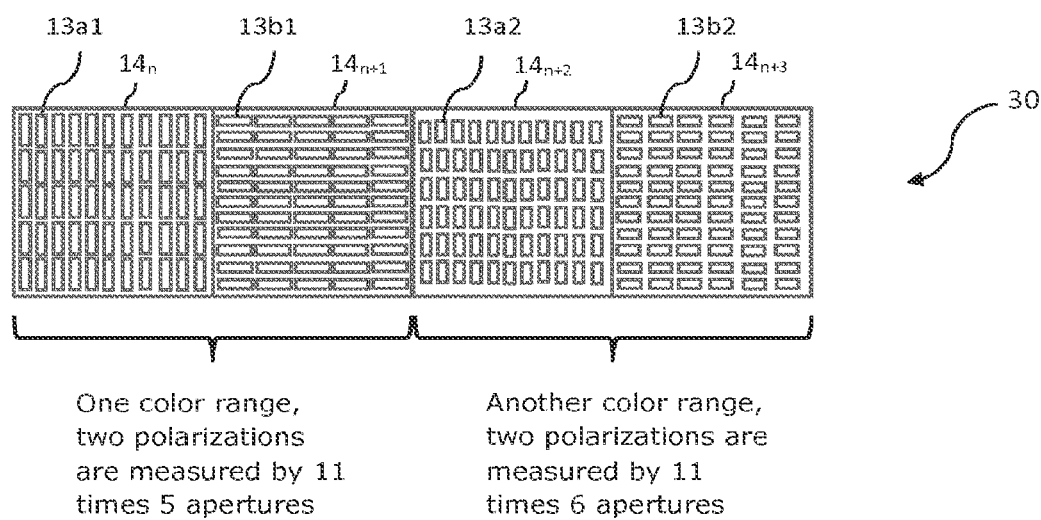
FIG. 4 is a schematic top view of an embodiment in which four adjacent pixels are shown and in which the apertures of the two adjacent pixels have mutually perpendicular, elongated rectangular cross sections.

FIG. 4 is a schematic top view of an embodiment of a sensor 30 in which four adjacent pixels are shown and in which the apertures of the two adjacent pixels have mutually perpendicular, elongated rectangular cross-sections. In the embodiment, the four adjacent pixels can be grouped in two pairs of two adjacent pixels and each pixel of the pair have mutually perpendicular, elongated rectangular cross sections. In the first pair made up of two pixels $14_n$ and $14_{n+1}$, the pixel $14_n$ has a plurality of first elongated apertures $13a1$ that overlies the pixel $14_n$ and the pixel $14_{n+1}$ has a plurality of second elongated apertures $13b1$ that overlies the pixel $14_{n+1}$ and that has a cross sectional shape that is equal to the cross sectional shape of the first elongated apertures $13a1$ but rotated by 90° with respect to the first elongated apertures $13a1$. Similarly, the second pair made up of two pixels $14_{n+2}$ and $14_{n+3}$, has elongated apertures $13a2$ and elongated apertures $13b2$ which overlie the pixel $14_{n+2}$ and the pixel $14_{n+3}$ respectively and that have the same cross-sectional shape but rotated by 90° with respect to the each other.

In correspondence to pixels $14_n$, $14_{n+2}$ the filter layer has apertures $13a1$, $13a2$ that are longer in the vertical direction of the figure while the apertures $13b1$, $13b2$ corresponding to pixels $14_{n+1}$, $14_{n+3}$ are longer in the horizontal direction. The length of the apertures along the short side may be equal for all apertures of the arrangement and may be sufficiently small so that all radiation polarized in a certain direction is filtered out which is desired to be measured by the sensor 30. However, the apertures $13a1$ of the pixel $14_n$ and the apertures $13a2$ of pixels $14_{n+2}$, have a different length along the long side to filter provide different cutoff frequencies and filter out radiation of different wavelength ranges. Similarly, the apertures $13b1$ of pixel group $14_{n+1}$ and apertures $13b2$ of pixel group $14_{n+3}$ may have different lengths along the long side. Adjacent pixels $14_n$ and $14_{n+1}$ of one pair may have equal lengths along the long side and measure, for example one color range in two different polarizations. Accordingly, pixels $14_n$ and $14_{n+1}$ employ an array of 11 times 5 apertures $13a1$, $13b1$, respectively. The next two adjacent pixels $14_{n+2}$, $14_{n+3}$ of the other pair have also equal lengths along the long side and measure another color range in two different polarizations by employing 11 times 6 apertures $13a2$, $13b2$, respectively.

In embodiments, the apertures may be arranged in certain patterns. In the following, b apertures represent apertures through which only blue light propagates, gb apertures represent apertures through which only green and blue light propagates, and rgb apertures represent apertures through which red, green, and blue light propagates.

In embodiments, the filter array with the apertures may be arranged so that each pixel is only coupled to apertures of the same size. In the case that the apertures are square apertures and that they are arranged in a square area on the pixel, the number of apertures per pixel may be 1, 4, 9, or other square numbers between 16 and 2500. Depending e.g. on the shape of the light sensitive area of the pixel, the number of apertures per pixel may also be non-square numbers such as 20 (4*5 apertures) or 130 (1013 apertures).

For embodiments with apertures arranged in patterns, the following features may be provided:

We have three types of pixels: (i) rgb for pixels that measure red, green, and blue light, (ii) gb pixels that measure green and blue light, and (iii) b pixels that measure blue light only.

The red component of light R may be calculated for a pixel by R=rgb−gb.

The green component of light G may be calculated for a pixel by G=gb−b.

The blue component of light B may be calculated for a pixel by B=b.

Similar to the Bayer color filter array, the light ranges may have to be interpolated for pixels for which they are not measured. As can be seen above, the gb pixel values are used for calculating two other light components so that it may be advantageous to have these values in the highest precision and with the highest frequency.

For this reason, an embodiment may have the following pixel array

| rgb | gb | rgb | gb | ... |
| gb  | b  | gb  | b  | ... |
| rgb | gb | rgb | gb | ... |
| gb  | b  | gb  | b  | ... |
| ... |    |     |    |     |

The dots represent a repeating continuation of the indicated sequence of pixels for the respective rows and columns. In an example, rgb gb rgb gb . . . represents a pattern of repeating rgb and gb pixels.

Figure 5:
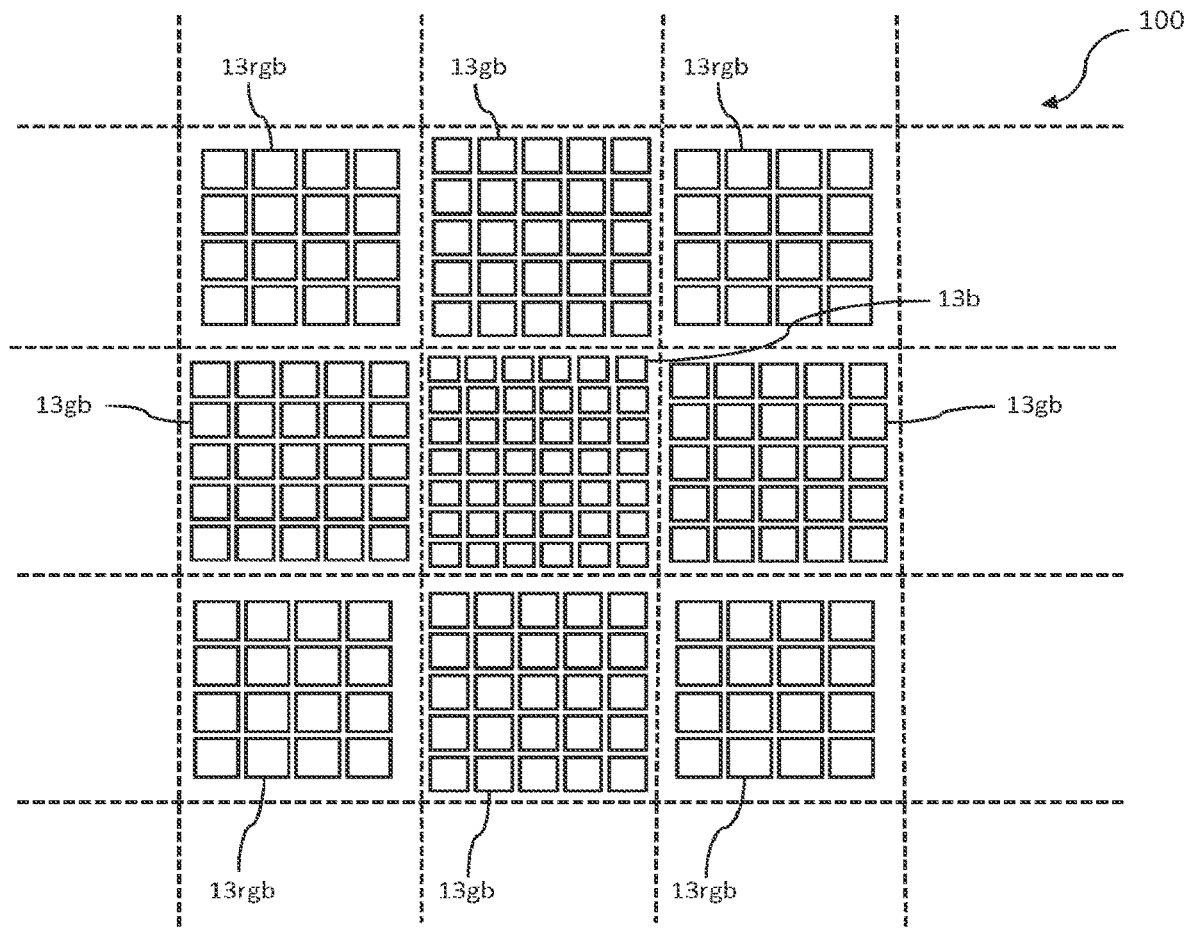
FIG. 5 is a schematic top view of an embodiment of an image sensor in which a 3×3 array of pixels is shown, each pixel having a group of apertures, wherein the apertures of the pixels have three different cross sectional sizes.

An example embodiment of an image sensor 100 having such a pixel array, for use with visible wavelength, is shown in FIG. 5. FIG. 5 is a schematic top view of an embodiment of the image sensor 100 in which a 3×3 array of pixels is shown, each pixel having an array of apertures, wherein the cross-sectional sizes of the apertures of the pixels have three different sizes. As can be seen, the pixel array comprises pixels $14_{n,m}$ (n, m=1, 2, 3, . . . ), each of which has a certain array of apertures. For example, the upper left, upper right, lower left and lower right pixels each have 4 times 4 apertures 13*rgb* of square shape. The size of these apertures 13*rgb* is such that the frequency cutoff lies at a frequency such that red, green and blue light propagates through the apertures, while infrared and lower frequency light is attenuated. The upper middle, lower middle, left middle and right middle pixels, in turn, have each 5 times 5 square apertures 13*gb*, sized so as to let green and blue light pass and no red light. The center pixel, finally, has 6 times 6 square apertures 13*b*, which are sized to let only blue light pass.

To calculate all three light components for all pixels, one may write:

| P_1,1: R = rgb − gb_i,  | G = gb_i − b_i, | B = b_i; |
| P_1,2: R = rgb_i − gb,  | G = gb − b_i,   | B = b_i; |
| P_2,2: R = rgb_i − gb_i,| G = gb_i − b,   | B = b;   | wherein the index i indicates that the value is an interpolated value for the pixel and not a measured value and P_m,n is the pixel at row m and column n of the 3 times 3 pattern in FIG. 5.

For the calculation of the interpolated values, similar methods as for the Bayer pattern may be used (where gb pixels of embodiments are twice as frequent as rgb pixels and as b pixels and correspond to green pixels of the Bayer pattern). One simple standard technique used for Bayer patterns is the bilinear interpolation which interpolates all missing values of each pixel for each channel separately. In an embodiment, this may mean:

1. All gb_i values are calculated in the following way for all rgb and b pixels from the four neighboring gb pixels as done here for P_2,2:

$gb\_i=(¼)*(P\_1,2+P\_2,1+P\_2,3+P\_3,2)$.

2. All rgb_i values are calculated in the following ways for the different pixels:

$P\_3,2{:}rgb\_i=(½)*(P\_3,1+P\_3,3)$, this is a 1. type of *gb* pixel $P\_2,3{:}rgb\_i=(½)*(P\_1,3+P\_3,3)$, this is a 2. type of *gb* pixel $P\_2,2{:}rgb\_i=(¼)*(P\_1,1+P\_1,3+P\_3,1+P\_3,3)$.

3. All b_i values are calculated in the following ways for the different pixels:

$P\_3,2{:}b\_i=(½)*(P\_2,2+P\_4,2)$, this is a 1. type of *gb* pixel $P\_2,3{:}b\_i=(½)*(P\_2,2+P\_2,4)$, this is a 2. type of *gb* pixel $P\_3,3{:}b\_i=(¼)*(P\_2,2+P\_2,4+P\_4,2+P\_4,4)$.

Thus, in an embodiment, first all relevant frequency ranges are determined for all pixels, either through direct measurements or through interpolation, and then, different color components are calculated for each pixel by subtractions of values for different frequency ranges. Such a procedure may also be used for more (or less) than three different frequency ranges as they are described here. In a different embodiment with four different frequency ranges, every second of the gb pixels of the array of FIG. 5 may be used for measuring the fourth frequency range. The values for the four different frequency ranges may then either be measured or interpolated from pixels close by that measure the respective frequency range. After the determination of all four frequency ranges for all pixels, the four different color components may be calculated by subtraction for each pixel.

Other techniques known in the art for interpolation for Bayer patterns can be applied in a corresponding way. Such techniques include: edge-directed interpolation, constant hue-based interpolation, median-based interpolation or Freeman interpolation, gradient-based interpolation or LaRoche-Prescott interpolation, weighted sum interpolation, interpolation with second order gradients as correction, Bayesian interpolation, homogeneity-directed interpolation, pattern-matching interpolation, alias cancellation interpolation, POCS.

In different embodiments, the rgb, gb, and b apertures may be arranged in patterns which are different from the pattern described above. Also, the rgb apertures (or b apertures) and the gb apertures may be exchanged so that twice as many rgb apertures (or b apertures) are present in the pattern than from the other two aperture types.

In a further embodiment, the rgb, gb, and b apertures may be arranged in in the following pattern:

| rgb | gb  | b   | gb  | ... |
| gb  | rgb | gb  | b   | ... |
| b   | gb  | rgb | gb  | ... |
| gb  | b   | gb  | rgb | ... |
| ... |     |     |     |     |

In a further embodiment, the number of rgb, gb, and b apertures may be substantially equal by using the following pattern:

| rgb | gb  | b   | rgb | ... |
| b   | rgb | gb  | b   | ... |
| gb  | b   | rgb | gb  | ... |
| rgb | gb  | b   | rgb | ... |
| ... |     |     |     |     |

According to a further aspect, embodiments with a filter layer with apertures that function as waveguides may also be used as a filter when provided as optical elements on transparent optical elements that are different from an image sensor. Such optical elements may be a lens or a glass element. The apertures may have all the same size to provide one cutoff frequency for all light going through the layer or they may have different sizes to pass light with a certain frequency distribution (where the distribution of apertures with different sizes determines the frequency distribution). Such a layer may provide filter characteristics that are not available by other optical filter types. The filter layer may also have elongated apertures to filter out light with a certain polarization.

Figure 6:
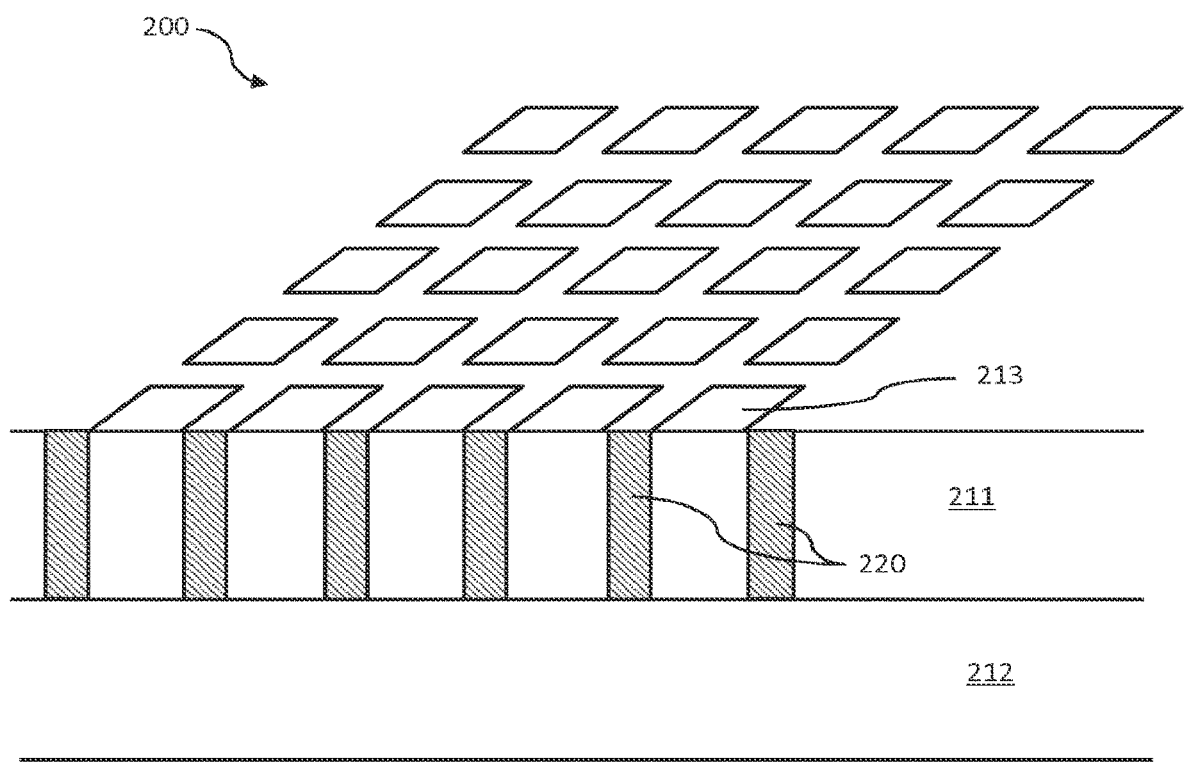
FIG. 6 is a cut sectional view of an optical element according to an embodiment.

FIG. 6 is a cut sectional view of an optical element 200 according to an embodiment. The optical element 200 has a first layer 211 for filtering radiation and a transparent element 212 which may be a transparent optical element. The transparent element 212 is transparent to the radiation that is desired to be filtered and it may be made of glass or transparent plastic or any other suitable material. The optical element 200 may have two air surfaces (one above the first layer 211 and one below the optical element) or one or two surfaces to other optical elements. The surfaces may be plane parallel, plane, or bent. The first layer 211 has at least one aperture 213 passing through the first layer 211 to the second layer, that is, transparent element 212, for propagating radiation therethrough. In the embodiment, there is a plurality of apertures 213 that are as close together as the fabrication process allows in order to reduce the light loss as much as possible. The cross sectional size of the apertures 213 is configured to provide a cutoff frequency so that radiation with a frequency below the cutoff frequency is attenuated inside the apertures 213 and radiation with a frequency above the cutoff frequency propagates through the 213. In the embodiment, the radiation with a frequency below the cutoff frequency decays exponentially inside the apertures 213 and the radiation with a frequency above the cutoff frequency propagates through the apertures 213 by coupling to one or more propagating modes inside the apertures 213.

In FIG. 6, the apertures 213 are perpendicular to the plane surface of the first layer 211 and have a constant cross section along the axis of the apertures 213. The cross section is symmetric and is a square cross section. However, in different embodiments the cross section may be rectangular, circular, or hexagonal. In the embodiment, the first layer 211 is metallic and the apertures 213 have metallic walls 220. In a different embodiment, the first layer 211 may include a non-metallic layer that is coated with a metallic layer so that the apertures still have one or more metallic walls. Generally, the depth of the apertures 213 or the thickness of the first layer determines how much radiation or light with a frequency below the cutoff frequency provided by the apertures can pass through the apertures. The first layer may be made sufficiently thick so that light below the cutoff frequency is attenuated to any desired amount.

In a different embodiment, the first layer 211 may include two, three or more apertures of different cross sectional sizes csi (i=1 . . . n), cs1>cs2>cs3 . . . . Each aperture or group of apertures of the same size may be configured to attenuate light having a frequency below respective cutoff frequencies w1, w2, w3, . . . and to propagate light having a frequency above respective cut-off frequencies wherein w1<w2<w3 . . . . By using apertures with different cross sectional sizes, it is possible to filter out light according to a distribution of cutoff frequencies. In an embodiment, half of the apertures may have a cutoff frequency that filters out red and green light and lets blue light pass and the other half of the apertures may filter out red light only. By using apertures with different cross sectional sizes, it may be possible to obtain filter characteristics that cannot be obtained with conventional filters. In a further embodiment, apertures with slowly changing cross sectional sizes may be used on an optical lens. In the embodiment, the filter layer may be used to filter out infrared light but the further away the apertures are from the center of the lens, the smaller the cross sectional sizes becomes so that in the peripheral parts of the lens more infrared light with high frequencies are filtered out compared to the center of the lens. This may improve the optical property of the lens.

In a further embodiment, the one or more apertures may be filled with a transparent material which may even provide an additional layer on the first layer. Such embodiments are similar to what is shown in FIG. 2C but instead of the light sensitive layer 12, there is the transparent element 212.

In FIG. 6, the apertures 213 have a constant, square cross section with a side length value a1 for one single sizes. The apertures 213 have metallic walls and the cutoff frequencies have corresponding cutoff wavelengths $\lambda_1$,cut-off above which the radiation decays exponentially inside the aperture 213 and below which the radiation propagates through the apertures 213. In the embodiment, a1 is equal to $\lambda_1$, cut-off/2.

In a further embodiment, the apertures may have more than one side length value, for example, they may have three values a1, a2, and a3. In such an embodiment, there would be three cutoff wavelengths $\lambda_1$, cut-off, $\lambda_2$, cut-off, and $\lambda_3$, cut-off with a1 equal to $\lambda_1$, cut-off/2, a2 equal to $\lambda_2$, cut-off/2, and a3 equal to $\lambda_3$, cut-off/2.

In an embodiment, the thickness $I_z$ of the first layer 211 or the depth d of the apertures 213 may be $$I\_z = d \geq (a\_1/\pi)(1/\mathrm{sqrt}(1-((2a\_1)/\lambda\_D,1)**2)),$$

wherein a1 is the largest side length value of the side length value ai (i=1 . . . n) and $\lambda\_D,1$ is a wavelength which is greater than the cut-off wavelength $\lambda_1$, cut-off=2a1 and which is the wavelength of radiation the intensity of which is attenuated inside the at least one aperture by a factor of at least $e^{-2}$ when reaching the second light-sensitive layer. The wavelengths $\lambda\_(D,1)$ and $\lambda_{i,\ cut\text{-}off}$ (i=1 . . . n) are the wavelengths of the incident radiation in vacuum when there is vacuum in the apertures and when there is matter in the apertures which has ε as the dielectric constant and p as the permeability, the wavelengths $\lambda\_(D,1)$ and $\lambda_{i,\ cut\text{-}off}$ (i=1 . . . n) are the wavelengths of the incident radiation in the matter. The matter in the apertures may be for example air, dielectric and transparent matter, or also vacuum (in which case the factor sqrt $((\mu\_0\ \varepsilon\_0)/(\mu\varepsilon))$ becomes one).

In a further embodiment, the apertures may be elongated, preferably rectangular in cross-section, so that the length of the at least one aperture in the elongated direction defines the cutoff frequency for radiation that is polarized perpendicularly to the elongated direction and the length of the at least one aperture in the direction perpendicular to elongated direction defines a further cutoff frequency that is greater than the cutoff frequency for radiation that is polarized perpendicularly to the elongated direction. In an embodiment, the further cutoff frequency may be greater than all relevant radiation, that is, only radiation that has such a high frequency that it is practically not relevant for the application for which the optical element is used can pass the optical element even if it has a polarization that is supposed to be filtered out. In an example, the further cutoff frequency may be in the frequency range of ultraviolet light or below the ultraviolet light.

In a further embodiment, the apertures may be tapering towards or away from the transparent element. This may be done to achieve a certain filter effect on the incident radiation.

Figure 7A:
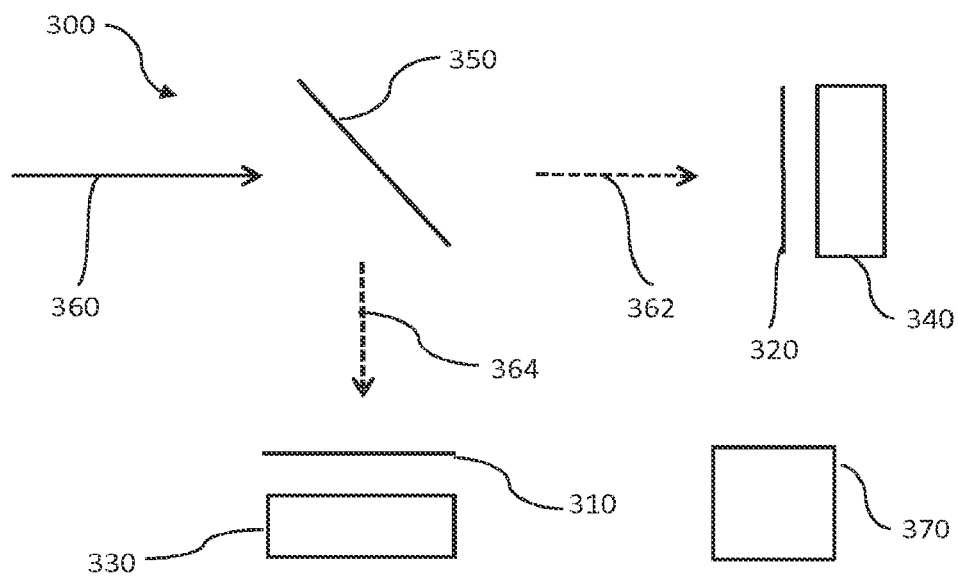
FIG. 7A is a schematic diagram of an optical device for measuring radiation in a certain range according to an embodiment.

FIG. 7A is a schematic diagram of an optical device 300 for measuring radiation in a certain range according to an embodiment. The certain range is defined as a frequency range between a first cutoff frequency and a second cutoff frequency. The optical device 300 includes a first optical element 310, a second optical element 320, a first detector 330 for detecting radiation, a second detector 340 for detecting radiation, a beam splitter 350, and a processing unit 370. The first optical element 310 and the second optical element 320 may be in accordance with one of the optical elements described above, for example, with the optical element shown in FIG. 6. In the embodiment, the first optical element 310 has apertures of a first cross sectional size that provide the first cutoff frequency and the second optical element 320 has apertures of a second cross sectional size that provide the second cutoff frequency which is greater than the first cutoff frequency. The detectors 330 and 340 may be any kind of detectors that detect or record radiation or light in the relevant frequency range. The detectors may include a CCD or CMOS image sensor with pixels for a spatially resolved detection of radiation or they may include a photomultiplier tube to detect the total amount of radiation without spatial resolution of the radiation. The beam splitter is configured to reflect a portion of impinging radiation and to transmit a further portion of the impinging radiation. The beam splitter may be preferably a pellicle mirror but also other types of beam splitters may be used such as beam splitters using two triangular prisms glued together or beam splitters using a dichroic coating. In an example, the beam splitter may reflect around 50% of the incident light in the certain range and transmit around 50% of the incident light in the certain range so that the amount of light between the two cutoff frequencies is equal to the difference of measured values between the first and second detectors. In the embodiment, the first and second optical elements 310 and 320 and the beam splitter 350 are arranged so that an incident beam 360 of radiation impinges first on the beam splitter 350 and a transmitted portion 362 and a reflected portion 364 coming from the beam splitter 350 impinge on the first optical element 310 and on the second optical element 320. In FIG. 7A, the reflected beam from the beam splitter impinges on the first optical element 310 and the transmitted beam from the beam splitter impinges on the second optical element 320. In a different embodiment, the position of the first optical element 310 and the second optical element 320 may be exchanged, that is, the reflected beam impinges on the second optical element and the transmitted beam impinges on the first optical element. In any case, the first detector 330 is arranged to detect radiation that passes through the first optical element 310 and the second detector 340 is arranged to detect radiation that passes through the second optical element 320. The processing unit 370 is configured to calculate the radiation with a frequency between a first cutoff frequency and a second cutoff frequency based on the radiation detected by the first detector 330 and the second detector 340. The processing unit 370 may be a computer that is communicatively coupled to the first and second detector to receive data that specify the amount of radiation that has been detected by the detectors 330 and 340. Assuming the beam splitter reflects around 50% of the incident light and transmits around 50% of incident light, the amount of radiation between the first cutoff frequency and the second cutoff frequency can be calculated by subtracting the amount of radiation detected by the second detector from the amount of radiation detected by the first detector. The calculation can be made for the total amount of radiation detected by the first and second detectors (e.g. if the first and second detectors are photomultiplier tubes). However, if the first and second detectors spatially resolve the detected radiation (e.g. if the first and second detectors are CCD or CMOS image sensors with pixels) the calculation can also be made for spatially resolved radiation by using values for example from corresponding pixels of image sensors used in the first and second detectors.

Figure 7B:
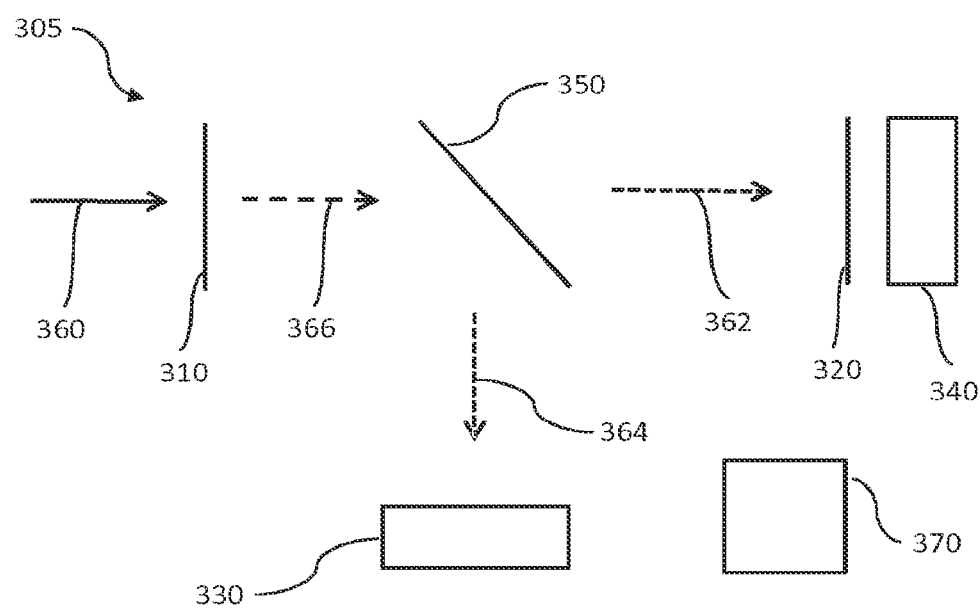
FIG. 7B is a schematic diagram of a further optical device for measuring radiation in a certain range according to an embodiment.

FIG. 7B is a schematic diagram of a further optical device 305 for measuring radiation in a certain range according to an embodiment. In the embodiment, the optical device 305 includes the same elements as the optical device 300, that is, a first optical element 310, a second optical element 320, a first detector 330 for detecting radiation, a second detector 340 for detecting radiation, a beam splitter 350, and a processing unit 370. However, the incident beam 360 of radiation impinges first on the first optical element 310 and filtered radiation 366 that passes through the first optical element 310 impinges then on the beam splitter 350. A transmitted portion 362 and a reflected portion 364 coming from the beam splitter 350 impinge on the first detector 330 and on the second optical element 320. In FIG. 7B, the reflected beam 364 from the beam splitter 350 impinges on the first detector 330 and the transmitted beam 362 from the beam splitter 350 impinges on the second optical element 320. In a different embodiment, the position of the first detector 330 and the second optical element 320 may be exchanged, that is, the reflected beam impinges on the second optical element and the transmitted beam impinges on the first detector. In any case, the second detector 340 is arranged to detect radiation that passes through the second optical element 320. Again, the processing unit 370 is configured to calculate the radiation with a frequency between a first cutoff frequency and a second cutoff frequency based on the radiation detected by the first detector 330 and the second detector 340. Assuming again that the beam splitter reflects around 50% of the incident light transmits around 50% of incident light, the amount of radiation between the first cutoff frequency and the second cutoff frequency can be calculated by subtracting the amount of radiation detected by the second detector 340 from the amount of radiation detected by the first detector 330. As in the embodiment of FIG. 7A, it depends on the first and second detectors if the calculation can be made for the total amount of radiation detected by the first and second detectors or for the spatially resolved radiation detected by the first and second detectors by using values for example from corresponding pixels of image sensors used in the first and second detectors.

The incident radiation as disclosed herein includes or is light of a range starting from and including ultraviolet light and ending with and including infrared light.

In an embodiment of an image sensor as disclosed herein, the first layer may be opaque to incident radiation that does not propagate through the at least one aperture and that is not attenuated inside the at least one aperture and/or the second light-sensitive layer 12 may absorb only radiation that has passed through the at least one aperture 13. In other words, only radiation that propagates through the at least one aperture and that is attenuated inside the at least one aperture passes through the first layer. The first layer may be considered as opaque to or as blocking incident radiation that does not pass through the at least one aperture so that only radiation that passes through the at least one aperture 13 passes through the first layer 11. Also, the first layer may be considered as opaque to incident radiation except for incident radiation that passes through the at least one aperture. In such an embodiment, the first layer provides as the only mode for the incident radiation to pass through the first layer that the incident radiation passes through the at least one aperture and the first layer does not provide any additional mode for the incident radiation to pass through the first layer. Especially, the first layer does not provide a plasmon mode or any kind of plasma excitation mode that allows the incident radiation to pass through the first layer. For embodiments with a first layer 11 that has a plurality of apertures 13, the first layer 11 may be opaque to incident radiation that does not pass through one of the apertures 13 (i.e. incident radiation that does not propagate through one of the apertures 13 and that is not attenuated inside one of the apertures 13). As a result, the second light-sensitive layer 12 absorbs only radiation that has passed through the apertures 13. Similarly, in the case of an optical element 200 as disclosed herein, the first layer 211 may be opaque to incident radiation that does not propagate through the at least one aperture 213 and that is not attenuated inside the at least one aperture 213 and/or wherein only radiation that passes through the at least one aperture 213 passes through the first layer 211. For embodiments with a first layer 211 that has a plurality of apertures 213, the first layer 211 may be opaque to incident radiation that does not pass through the apertures 213 (i.e. incident radiation that does not propagate through the apertures 213 and that is not attenuated inside the apertures 213)

In an embodiment of an image sensor with an array of pixels as disclosed herein, each pixel of the array of pixels may record the amount of intensity of radiation propagating through the one or more apertures of the group of apertures coupled to the pixel together with the amount of intensity of radiation attenuated inside the one or more apertures of the group of apertures coupled to the pixel. In such an embodiment, each pixel of the array of pixels may not record any further radiation.

In an embodiment of an image sensor with an array of pixels as disclosed herein, the first layer may have walls between the apertures coupled to the same pixel that are thinner than the cross sectional size of the apertures coupled to the same pixel. The cross sectional size of an aperture may be equal to the side length for a square aperture, may be equal to the diameter for a circular aperture, and may be equal to the largest diagonal of rectangular or polygonal apertures.

Figure 8:
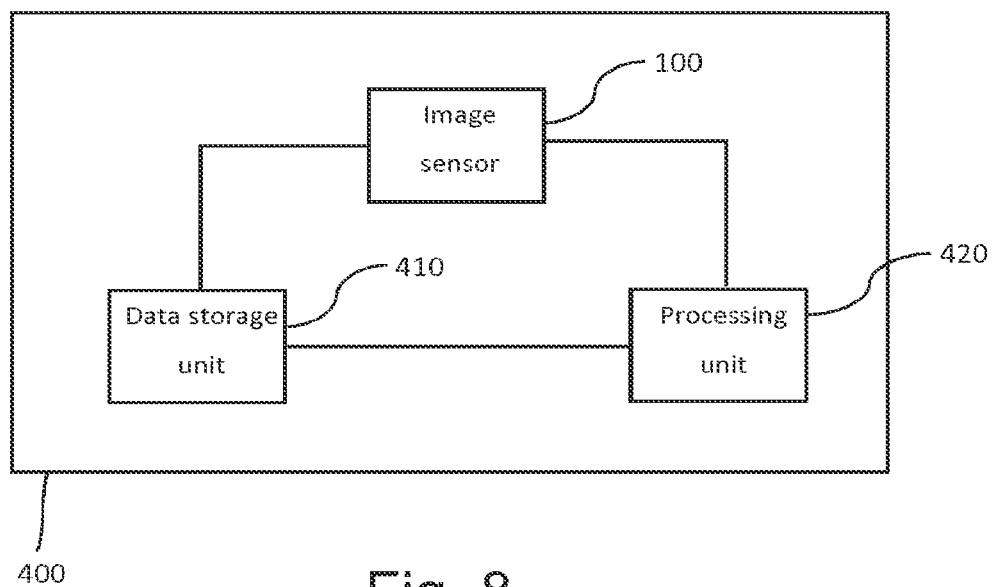
FIG. 8 is a block diagram of an image capturing device that has an image sensor according to an embodiment.

FIG. 8 is a block diagram of an image capturing device 400 that has an image sensor 100 with an array of pixels as disclosed herein, a data storage unit 410, and a processing unit 420. The data storage unit 410 may be communicatively coupled to the image sensor 100 as represented by a line connecting the data storage unit 410 and the image sensor 100. The image capturing device 400 may be configured to store radiation intensity values measured by pixels of the array of pixels of the image sensor in the data storage unit 410. The processing unit 420 may be communicatively coupled to the image sensor 100 and the storage unit 410. The communicative coupling between the components of the image capturing device 400 may be configured to transfer data from the image sensor 100 to the data storage unit 410 to be stored there. The data from the image sensor 100 may be transferred directly to the data storage unit 410 or may be transferred to the processing unit 420, be processed there, and then be stored in the data storage unit 410. In an embodiment, the processing unit 420 may access or retrieve data from the data storage unit 410, process them, and store the transformed data in the data storage unit 410. In a further embodiment, the image capturing device 400 may have an image sensor that is in accordance with the image sensor 10 or 30 as disclosed herein.

The image capturing device 400 may be a digital camera or a digital camera component of a larger device such as a smartphone, a tablet, or a laptop. The data storage unit 410 may comprise a memory device such as a random access memory (RAM), or non-volatile memory devices such as flash memory. The data may be stored on memory cards that can be taken out of the image capturing device 400 and be read in a different device that is able to read and process the data. The data storage unit 410 may also be located in a different housing than the image sensor 100. The processing unit 420 may be an integrated circuit or a computer processing unit as it is used in digital cameras or other devices having a digital camera component.

The processing unit 420 may be configured to calculate a representation of an image captured by the image sensor 100. The representation may include a tuple of one or more values for each pixel of the array of pixels, each tuple may represent a color value for a pixel of the representation. Color value is used here in a general sense: For an image sensor with apertures that have all the same cross sectional size, the color value may a value representing a luminosity value of the pixel. For an image sensor with apertures that have two, three, four or more different cross sectional sizes, the color value may represent light by characterizing components of the light for ranges between one or two cutoff frequencies provided by the apertures of the image sensor.

In an embodiment, the first layer of the image sensor 100 may have an array of apertures that have two or more different cross sectional sizes and the processing unit 420 may be configured to calculate a tuple for a pixel of the array of pixels based on a radiation value measured by the pixel for a wavelength range and/or based on a radiation value interpolated for the pixel for one or more further wavelength ranges. The processing unit 420 may be also configured to calculate the tuple for the pixel using a calibration matrix that relates one or more radiation values for the pixel (which may have been measured or interpolated) to each value of the tuple for the pixel.

In an embodiment, the apertures of the image sensor 100 may have three or more different cross sectional sizes and the tuple for each pixel includes a value, R, representing a red component, a further value, G, representing a green component, and a still further value, B, representing a blue component. In such an embodiment, the representation may be or include a color space according to which the RGB values are interpreted. Possible color spaces include sRGB, Adobe RGB, and ProPhoto RGB.

As disclosed for FIG. 5, the three light components R, G, and B for pixels that measure light in three different wavelength ranges (rgb for red and green and blue light, gb for green and blue light, and b for blue light) may be written as follows:

| P_1,1: R = rgb − gb_i, | G = gb_i − b_i, | B = b_i; |
| P_1,2: R = rgb_i − gb, | G = gb − b_i, | B = b_i; |
| P_2,2: R = rgb_i − gb_i, | G = gb_i − b, | B = b. |

Deleting the index i which indicates that the value for the range has been interpolated and not measured the equations can be represented with a matrix:

$$c_i = \Sigma_j a_{ij} v_j,$$

wherein the $c_i$ represents the three color components R, G, and B for i=1, 2, and 3 respectively, $v_j$ represents the three measured or interpolated radiation values for the light ranges rgb, gb, and b for j=1, 2, and 3 respectively, and $a_{ij}$ are the elements of a calibration matrix that relates the measured or interpolated radiation intensity values of a pixel to the one or more values of a tuple for the pixel. The tuple may be a representation of the color or light value at the position of the pixel.

The above matrix equation can be generalized to any number of different wavelength ranges that are measured by pixels of an image sensor as disclosed herein and also to different polarizations. In this case, the $v_j$ that are the measured or interpolated values for one or more wavelength ranges related to the cutoff frequencies provided by an embodiment can have p different values (i.e. j=1, ..., p) in the matrix equation above. The above matrix equation can further be generalized to any number of values of the tuple representing a generalized color value at a pixel location. In this case, the $c_i$ that are the values of the tuple of a pixel can have q different values (i.e. i=1, ..., q) in the matrix equation above. In an example, the image sensor may have apertures with four different cross sections that are arranged in a repeating pattern and that provide four cutoff frequencies in the range above the ultraviolet light and below the infrared light. Such an image sensor may be able to record colors more accurately and also record more colors (i.e. provides a larger color gamut) than an image sensor that measures light in only three different wavelength ranges (according to a conventional design or according to an embodiment as disclosed herein). The index j is then summed over the values 1 to 4. Further increasing the number of cutoff frequencies in the visible light range may further increase the accuracy with which colors in the visible light range are measured and further increase the number of colors that can be measured and distinguished. In one embodiment, the tuple may still have only three components for red, green, and blue even if the number of different cutoff frequencies and thus wavelength ranges is larger than three. However, in another embodiment the tuple may have four components corresponding to the four ranges limited by the different cutoff frequencies. In a further embodiment, the image sensor may have apertures of six different cross sectional sizes, four of them providing cutoff frequencies in the visible light range, one of them providing a cutoff frequency in or above the infrared wavelength range and one of them providing a cutoff frequency in or below the ultraviolet wavelength range. In this case, the tuple may have six values: one value for specifying the light component in the ultraviolet range, four for the visible light range, and one for the infrared range. In a different embodiment, the tuple may have five values: one for the ultraviolet range, three for the visible light range, and one for the infrared range. In further embodiments, more than one cutoff frequency may be located in the infrared light range to distinguish different spectral distributions in the infrared range. In an example, the images sensor may have apertures providing three different cutoff frequencies in the infrared range and one to distinguish infrared light from visible light. In this case, it is possible to characterize infrared light with three components for the three ranges limited by the four cutoff frequencies. It may even be possible to use a fourth component for characterizing the infrared component in the wavelength range above the largest cutoff wavelength which corresponds to the lowest cutoff frequency. Similarly, it is possible use more than one cutoff wavelength in the ultraviolet range to distinguish light having different components in subranges of the ultraviolet light range.

The elements $a_{ij}$ of the calibration matrix may be determined by comparing a representation of a captured image of objects of known color as obtained by an embodiment to the known values of the objects. The known values of the objects may have been obtained from a representations of these objects obtained through another, calibrated camera. The elements of the calibration matrix may then be optimized to match the known colors as well as possible. The results of the optimization may depend on the values of the cutoff frequency provided by the apertures of the image sensor and also on the thickness of the first layer that affects how much light below the cutoff frequency is attenuated inside the apertures. In an embodiment, the object may be a sheet of paper with many different color patches the representation of which is known or has been measured. Once, the elements $a_{ij}$ of the calibration matrix have been determined, they may be stored and retrieved to be used to calculate the color components $c_i$, that is, the values of the tuple for each pixel according to the above matrix equation.

Figure 9:
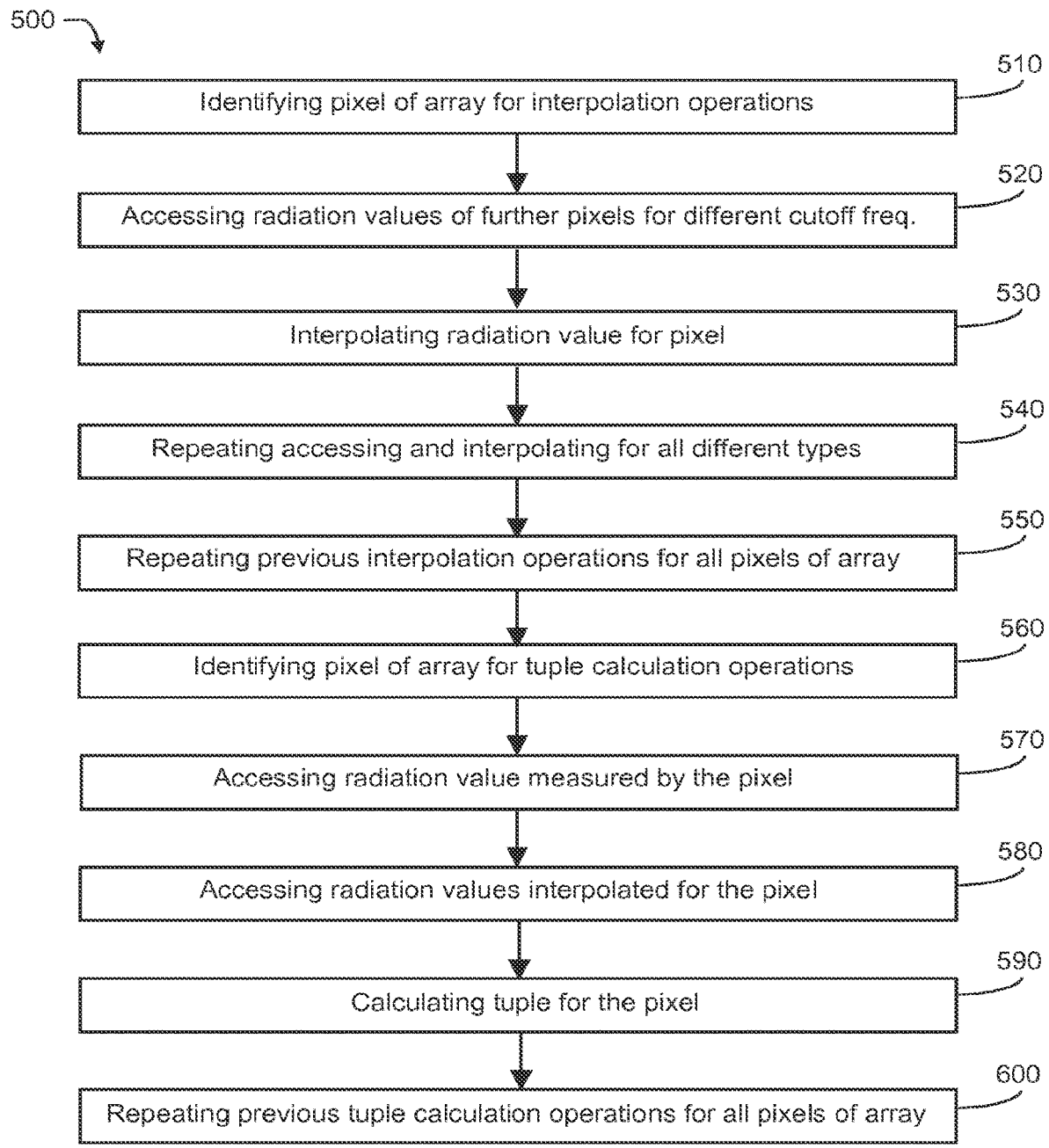
FIG. 9 is a flow diagram of a method for calculating a representation of an image captured by an image sensor according to an embodiment.

FIG. 9 is a flow diagram of a computer implemented method 500 for calculating a representation of an image captured by an image sensor 10, 30, 100. The image sensor 10, 30, 100 may comprise a first layer 11 for filtering the incident radiation by attenuating incident radiation with a frequency that is below a cutoff frequency and a second light-sensitive layer 12 for absorbing the radiation passing through the first layer 11. The first layer 11 may precede the second light-sensitive layer 12 in a direction of propagation of the incident radiation. The light-sensitive layer 12 may comprise an array of pixels and the image sensor 10, 30, 100 may have pixels of the same type or have pixels of two or more different types. The type of a pixel may be defined as follows: a first pixel is of a different type than a second pixel if and only if the first layer 11 provides a cutoff frequency for the first pixel that is different from a cutoff frequency provided by the first layer 11 for the second pixel. Thus, if the cutoff frequency provided by the first layer for two different pixels is the same then the two pixels are of the same type.

For an image sensor with pixels that all have the same type, the method 500 may include a simple version of calculation operations that relies only on directly measured radiation values and not on interpolated radiation values. In such a case, the method 500 may include identifying 560 a pixel of the array of pixels for tuple calculation operations, accessing 570 a radiation value measured by the pixel, and calculating 590 one or more values of a tuple of one or more values for the pixel using the radiation value measured by the pixel. In an embodiment, the tuple may have only one value representing the amount of radiation that has passed through the apertures in the first layer 11 which all have the same cross sectional size. The tuple may representing a generalized color value with respect to a certain representation such as a luminosity value for a black and white representation. The method 500 may further comprise repeating 600 the tuple calculation operations for all pixel of the array of pixels. This may mean repeating 600 accessing 570 a radiation value measured by the pixel and calculating 590 one or more values of a tuple for the pixel for all pixels of the array of pixels. As a result of the method 500, the representation of the image captured by the image sensor 10, 30, 100 is obtained.

The computer implemented method 500 may be executed by any kind of computing device. Such a computing device may be provided by or by housed in an image capturing device 400 as disclosed herein or by a general computing device that is configured to load instructions and execute them. The instructions may control the computing device so that the operations of the method 500 are executed by the computing device. A general computing device may be a laptop, a personal computer, a server, or larger computing devices, it may also be a tablet, or a smart phone that also comprises an image capturing device 400 as a component.

In the case that the image sensor has pixels of two or more different types, the method 500 may further include interpolation operations. The interpolation operations may include prior to identifying 560 a pixel, identifying 510 a further pixel of the array of pixels, accessing 520 one or more radiation values measured by still further pixels for a further cutoff frequency that is different from the cutoff frequency for which a radiation value has been measured by the further pixel, and interpolating 530 for the further pixel a radiation value for the further cutoff frequency. For the case that image sensor has pixels of three or more different types, the method 500 may further include repeating 540 accessing 520 one or more radiation values and interpolating 530 for the further pixel a radiation value for all types of pixels of the array which are different from the type of the further pixel. In other words, the method includes interpolating radiation values for each different cutoff frequency provided by the image sensor for the pixel being processed. The method 500 may further include repeating 550 previous interpolation operations for all pixels of the array. The interpolation operations may include accessing 520 one or more radiation values measured by still further pixels, interpolating 530 for the further pixel a radiation value, and repeating 540 accessing 520 one or more radiation values and interpolating 530 for the further pixel a radiation value. This may conclude the interpolation operations but the interpolated values may be used to extend the tuple calculation operations to take into account the interpolated values. Thus, following identifying 560 the pixel of the array for the tuple calculation operations, the method 500 may further include accessing 580 the one or more radiation values interpolated for the pixel, calculating 590 the tuple for the pixel using the radiation value measured by the pixel and the one or more radiation values interpolated for the pixel, and repeating 600 accessing 580 one or more radiation values interpolated for the pixel and calculating 590 the tuple for the pixel for all pixels of the array of pixels.

In an embodiment of the method 500, the operation calculating 590 the tuple for the pixel may comprise using a calibration matrix that relates each measured or interpolated radiation value for the pixel to each value of the tuple for the pixel. In a further embodiment, the image sensor 10, 30, 100 may have three or more types of pixels and the tuple for the pixel may have a value representing a red component, a further value representing a green component, and a still further value representing a blue component.

In an embodiment of the method 500, the first layer 11 of the image sensor 10, 30, 100 may be opaque to incident radiation that does not propagate through the at least one aperture 13 and that is not attenuated inside the at least one aperture 13 and/or wherein the second light-sensitive layer 12 absorbs only radiation that has passed through the at least one aperture 13.

The invention claimed is:

1. An optical element (200) comprising:
a layer (211) for filtering radiation by attenuating incident radiation with a frequency that is below a cutoff frequency; and
a transparent element (212),
wherein the layer (211) comprises at least one aperture (213) passing through the layer (211) to the transparent element (212) for propagating radiation therethrough, wherein the at least one aperture (213) is perpendicular to the plane surface of the layer (211), wherein the at least one aperture (213) has a constant cross section along the axis of the at least one aperture (213) and the cross section is symmetric,
wherein the cross sectional size of the at least one aperture (213) is configured to provide the cutoff frequency so that radiation with a frequency below the cutoff frequency is attenuated inside the at least one aperture (213) and radiation with a frequency above the cutoff frequency propagates through the at least one aperture (213),
wherein incident radiation that does not pass through the at least one aperture (213) is blocked from passing through the layer (211), and
wherein an intensity of radiation that has a frequency below the cutoff frequency and that reaches the transparent element (212) is controlled by the thickness of the layer (211).

2. The optical element (200) of claim 1, wherein the radiation with a frequency below the cutoff frequency decays exponentially inside the at least one aperture (213).

3. The optical element (200) of claim 1, wherein radiation with a frequency above the cutoff frequency propagates through the at least one aperture (213) by coupling to one or more propagating modes inside the at least one aperture (213).

4. The optical element (200) of claim 1, wherein the cross section is a square, rectangular, circular, or hexagonal cross-section.

5. The optical element (200) of claim 1, wherein the layer (211) is metallic or wherein the layer (211) comprises a non-metallic layer that is coated with a metallic layer so that in both cases, the at least one aperture has one or more metallic walls (220).

6. The optical element (200) of claim 1, wherein the layer (211) comprises two, three or more apertures of different cross sectional sizes csi (i=1 ... n), cs1>cs2>cs3 ..., each aperture being configured to attenuate light having a frequency below respective cutoff frequencies w1, w2, w3, ... and to propagate light having a frequency above respective cut-off frequencies, wherein w1<w2<w3 ....

7. The optical element (200) of claim 1, wherein the at least one aperture is filled with a transparent material.

8. The optical element (200) of claim 7, wherein the transparent material provides an additional layer on the layer (211).

9. The optical element (200) of claim 1, wherein the at least one aperture (213) has a constant, square cross section with a side length value ai (i=1 ... n) for n different sizes, the at least one aperture has metallic walls (220), and the cutoff frequencies have corresponding cutoff wavelengths $\lambda_{i,\ cut-off}$ (i=1 ... n) above which the radiation decays exponentially inside the at least one aperture (213) and below which the radiation propagates through the at least one aperture and wherein ai is equal to $\lambda_{i,\ cut-off}/2$ (i=1 ... n).

10. The optical element (200) of claim 9, wherein the thickness $l_z$ of the layer (211) or the depth d of the at least one aperture (213) is $$l_z = d \geq \left(\frac{a_1}{\pi}\right)\frac{1}{\sqrt{1-\left(\frac{2a_1}{\lambda_{D,1}}\right)^2}},$$

wherein $a_1$ is the largest side length value of the side length value $a_i$ (i=1 ... n) and $\lambda_{D,1}$ is a wavelength which is greater than the cut-off wavelength $\lambda_{i,\,cut\text{-}off} = 2a_1$ and which is the wavelength of radiation the intensity of which is to be attenuated inside the at least one aperture (213) by a factor of at least $e^{-2}$, wherein the wavelengths $\lambda_{D,1}$ and $\lambda_{i,\,cut\text{-}off}$ (i=1 . . . n) are the wavelengths of the incident radiation in a material of the aperture.

11. The optical element (200) of claim 1, wherein the at least one aperture is elongated, preferably rectangular in cross-section, so that the length of the at least one aperture in the elongated direction defines the cutoff frequency for radiation that is polarized perpendicularly to the elongated direction and the length of the at least one aperture in the direction perpendicular to elongated direction defines a further cutoff frequency that is greater than the cutoff frequency for radiation that is polarized perpendicularly to the elongated direction.

12. The optical element (200) of claim 1, wherein the at least one aperture is tapering towards or away from a back surface of the layer (211).

13. The optical element (200) of claim 1, wherein the layer (211) is opaque to incident radiation that does not propagate through the at least one aperture (213) and that is not attenuated inside the at least one aperture (213).

14. An optical device (300, 305) for measuring radiation with a frequency between a first cutoff frequency and a second cutoff frequency, comprising:
  a first optical element (310) of claim 1;
  a second optical element (320);
  a first detector (330) for detecting radiation;
  a second detector (340) for detecting radiation;
  a beam splitter (350) to reflect a portion of radiation and to transmit a further portion of radiation; and
  a processing unit (370) configured to calculate the radiation with a frequency between a first cutoff frequency and a second cutoff frequency based on the radiation detected by the first detector (330) and the second detector (340);
  wherein the first optical element has apertures of a first cross sectional size that provide the first cutoff frequency and the second optical element has apertures of a second cross sectional size that provide the second cutoff frequency, the second cutoff frequency being greater than the first cutoff frequency and wherein the first and second optical elements and the beam splitter are arranged so that either (i) an incident beam (360) of radiation impinges first on the beam splitter (350) and a transmitted portion (362) and a reflected portion (364) coming from the beam splitter (350) impinge on the first optical element (310) and on the second optical element (320), the first detector (330) being arranged to detect radiation that passes through the first optical element (310) and the second detector (340) being arranged to detect radiation that passes through the second optical element (320) or (ii) an incident beam (360) of radiation impinges first on the first optical element (310) and filtered radiation (366) that passes through the first optical element (310) impinges on the beam splitter (350) and a transmitted portion (362) and a reflected portion (364) coming from the beam splitter (350) impinge on the first detector (330) and on the second optical element (320), the second detector (340) being arranged to detect radiation that passes through the second optical element (320).

\* \* \* \* \*